(12) United States Patent
Yamaguchi

(10) Patent No.: US 6,727,724 B2
(45) Date of Patent: Apr. 27, 2004

(54) CHARACTERISTIC EVALUATION APPARATUS FOR INSULATED GATE TYPE TRANSISTORS

(75) Inventor: Kenji Yamaguchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/093,933

(22) Filed: Mar. 11, 2002

(65) Prior Publication Data

US 2002/0130679 A1 Sep. 19, 2002

Related U.S. Application Data

(63) Continuation of application No. 09/714,148, filed on Nov. 17, 2000, now Pat. No. 6,373,274, which is a continuation of application No. 09/249,139, filed on Feb. 12, 1999, now Pat. No. 6,169,415.

(30) Foreign Application Priority Data

Aug. 25, 1998 (JP) .......................... P10-239148

(51) Int. Cl.$^7$ .............................................. G01R 31/26
(52) U.S. Cl. ...................................... 324/769; 324/719
(58) Field of Search ................................ 324/769, 719, 324/765; 438/14, 17; 257/48

(56) References Cited

U.S. PATENT DOCUMENTS

| | | | | |
|---|---|---|---|---|
| 5,646,870 A | * | 7/1997 | Krivokapic et al. | 716/4 |
| 5,838,164 A | * | 11/1998 | Chen | 324/769 |
| 6,107,108 A | * | 8/2000 | Chen et al. | 438/14 |
| 6,407,573 B1 | * | 6/2002 | Yamaguchi et al. | 324/769 |

OTHER PUBLICATIONS

U.S. patent application No. 10/093,933, filed Mar. 11, 2002, pending.*

* cited by examiner

*Primary Examiner*—Kamand Cuneo
*Assistant Examiner*—Russell M. Kobert
(74) *Attorney, Agent, or Firm*—Oblon, Spivak, McClelland, Maier & Neustadt, P.C.

(57) ABSTRACT

The accuracy of effective channel width extraction in drain current method is improved. There are prepared a transistor with a wide channel width serving as a reference, and a transistor with a narrow channel width that becomes a candidate for extraction (step ST1.1). From the characteristic curve of a plane formed by mask channel width and source-drain conductance, there is extracted a virtual point at which the change of source-drain conductance is estimated to be approximately zero even if the gate overdrive is finely changed. Then, the value of function F is calculated which is defined by the difference between the change of the conductance at the coordinate of the virtual point and the product obtained by multiplying the conductance per unit width by the change of the mask channel width (step ST1.6). From a shift amount ($\delta$) which minimizes the standard deviation of the function F to be obtained (step ST1.7), the true threshold voltage of the transistor with the narrow channel width is determined (step ST1.10).

9 Claims, 25 Drawing Sheets

F I G . 24
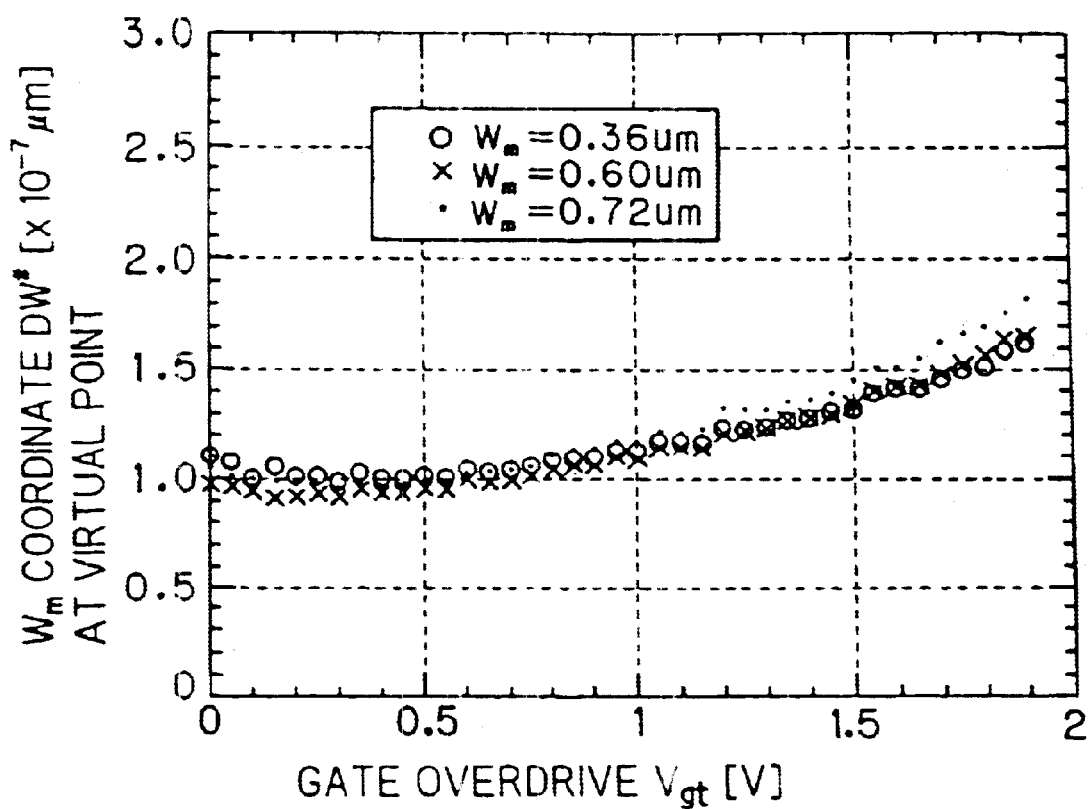

CHARACTERISTIC EVALUATION APPARATUS FOR INSULATED GATE TYPE TRANSISTORS

This application is a continuation of Ser. No. 09/714,148, filed Nov. 17, 2000 now U.S. Pat. No. 6,373,274 which is a continuation of Ser. No. 09/249,139, filed Feb. 12, 1999 now U.S. Pat. No. 6,169,415.

BACKGROUND OF THE INVENTION

1. Field of the Invention

The present invention relates to a characteristic evaluation method for insulated gate type transistors which extracts their effective channel widths, a characteristic evaluation apparatus for insulated gate type transistors, a method of manufacturing insulated gate type transistors by using the above characteristic evaluation method, and a computer readable storing medium storing a characteristic evaluation program.

2. Description of the Background Art

An electrically effective channel width, i.e., an effective channel width $W_{eff}$, can be determined from the drain currents of two or more insulated gate type transistors having the same channel length and a different channel width. This method is generally called "drain current method." The drain current method can directly determine the difference between an effective channel width $W_{eff}$ and a mask channel width $W_m$, namely, a channel narrowing $DW(=W_m-W_{eff})$.

As a drain current method, a wide variety of methods have been proposed heretofore. They are described, for example, in "A New Method to Electrically determine Effective MOSFET Channel Width" by Y. R. Ma and K. L. Wang, IEEE Trans. Elect. Dev., ED-29, p. 1825, 1982; "A New Method to Determine the MOSFET Effective Channel Width" by N. D. Arora, L. A. Blair and L. M. Richardson, IEEE Trans. Elect. Dev., ED-37(3), p. 811, 1990; "A Method to Extract Gate-Bias-Dependent MOSFET's Effective Channel Width" by Y. T. Chia and G. J. Hu, IEEE Trans. Elect. Dev., ED-38(2), p. 424, 1991; and "A Direct Method to Extract Effective Geometries and Series Resistances of MOS Transistors" by P. R. Karlsson and K. O. Jeppson, Proc. IEEE ICMTS, vol. 7, p. 184, 1994.

Of various drain current methods, Chia method is commonly often used. Thus, Chia method will be briefly described here. The total source-drain resistance R is given by the sum of a channel resistance $R_{ch}$ and an external resistance $R_{sd}$. Now, supposing the following Equation 1 as the equation to express drain current.

$$I_{ds} = \frac{\beta_0 \cdot \left(V_{gs} - V_{th} - \frac{V_{ds}^*}{2}\right) \cdot V_{ds}^*}{1 + \theta 1 \cdot (V_{gs}^* - V_{th}) + \theta 2 \cdot (V_{gs}^* - V_{th})^2} \quad \text{(Eq. 1)}$$

where $\beta_0$, $V_{ds}^*$ and $V_{gs}^*$ are given by the following Equations 2, 3 and 4, respectively, and $\theta 1$ and $\theta 2$ are the invariables.

$$\beta_0 = \frac{\mu_0 C_{ox} W_{eff}}{L_{eff}} \quad \text{(Eq. 2)}$$

where $\mu_0$ is a carrier mobility, $L_{eff}$ is an effective channel length, $W_{eff}$ is an effective channel width, and $C_{ox}$ is a gate insulating film capacity.

$$V_{ds}^* = V_{ds} - I_{ds} \cdot R_{sd} \quad \text{(Eq. 3)}$$

$$V_{gs}^* = V_{gs} - \frac{I_{ds} \cdot R_{sd}}{2} \quad \text{(Eq. 4)}$$

Neglecting the term of θ2, Equation 5 is obtained from Equations 1, 3 and 4. Supposing an external resistance $R_{sd}$ is inversely proportional to an effective channel width $W_{eff}$, a channel narrowing DW can be extracted through the following procedure.

$$I_{ds} = \frac{\beta_0 \cdot \left(V_{gs} - V_{th} - \frac{V_{ds}}{2}\right) \cdot V_{ds}}{1 + (\theta 1 + \beta_0 \cdot R_{sd}) \cdot (V_{gs} - V_{th})} \quad \text{(Eq. 5)}$$

where the difference between a gate voltage and a threshold voltage, ($V_{gs}-V_{th}$), is defined as a gate overdrive $V_{gt}$.

Step 1: Against a certain gate overdrive $V_{gt}$, $I_{ds}-W_m$ characteristic is plotted in an X-Y plane whose X-axis is mask channel $W_m$ and Y-axis is drain current $I_{ds}$, and a linear fitting is made. At that time, the intersection with the X-axis in the X-Y plane which is obtained by extrapolating each straight line is the channel narrowing DW ($V_{gt}$) in the gate overdrive $V_{gt}$ (see FIG. 1).

Step 2: By repeating step 1 while changing the gate overdrive $V_{gt}$, it can be seen how the channel narrowing DW ($V_{gt}$) depends on the gate overdrive $V_{gt}$ (see FIG. 1).

Prior art characteristic evaluation method for insulated type transistors is constructed as described. In Chia method, for example, it is necessary to know the threshold voltage of a transistor for use in extraction. The threshold voltage of a transistor is found by, for example, extrapolation from the characteristic between gate voltage and source-drain current, as shown in FIG. 2. Therefore, the error due to the uncertainty of a threshold voltage is further pronounced with reducing transistor size.

SUMMARY OF THE INVENTION

According to a first aspect of the present invention, a characteristic evaluation apparatus for insulated gate type transistors in which at least two insulated gate type transistors that differ from each other only in mask channel width are used for evaluation and the characteristic of a first insulated gate type transistor having a wide mask channel width serves as a reference, to evaluate the characteristic of a second insulated gate type transistor having a narrow mask channel width. This apparatus comprises: a threshold voltage estimation means that extracts the threshold voltage of the first transistor, estimates the threshold voltage of the second transistor, and employs a value as estimated, as a first estimated value; an extraction means in which (i) a difference between a gate voltage of the first transistor and the extracted threshold voltage of the first transistor is defined as a first gate overdrive, and a difference between a gate voltage of the second transistors and the first estimated value is defined as a second gate overdrive, (ii) in an X-Y plane whose X-axis is the mask channel width and Y-axis is source-drain conductance, a virtual point at which a change of Y coordinate value is estimated to be approximately zero when the first and second gate overdrives are finely changed, is extracted from a characteristic curve exhibiting a relationship between the mask channel widths of the first and second transistors and the source-drain conductance, (iii) values of the X coordinate and Y coordinate at the virtual point are defined as second and third estimated values, respectively, and (iv) a slope of the characteristic curve at the virtual point is extracted and a value of the slope is employed as a fourth estimated value; a threshold voltage determination means in which (i) from the second to fourth estimated values, optimum second to fourth estimated values are found with which the change of the third estimated value is equal to the product of the change of the second estimated value and the fourth estimated value, in reply to fine changes of the first and second gate overdrives, (ii) an optimum first estimated value is determined which corresponds to the optimum second to fourth estimated values, and (iii) a true threshold voltage of the second transistor is determined based on the optimum first estimated value; and a channel narrowing determination means that determines a difference between the mask channel width and an effective channel width, based on the true threshold voltage.

According to a second aspect, the characteristic evaluation apparatus of the first aspect is characterized in that the extraction means approximates the characteristic curve by using a first straight line in the X-Y plane, the first straight line passing through a first point that is given to the first transistor when the first gate overdrive has a first value and a second point that is given to the second transistor when the second gate overdrive has the first value.

According to a third aspect, the characteristic evaluation apparatus of the second aspect is characterized in that the threshold voltage determination means determines the optimum second to fourth estimated values from a relational expression:

$$F(\delta, V_{gtWi}) = dW^{}(\delta, V_{gtWi}) + \frac{f(\delta, V_{gtWi})}{f'(\delta, V_{gtWi})} \cdot dW^{\prime}(\delta, V_{gtWi}) - DW^*(\delta, V_{gtWi})$$

where $\delta$ is a difference between an estimated value of the threshold voltage of the second transistor, i.e., a first estimated value, and the threshold voltage of the first transistor; $V_{gtWi}$ is the first gate overdrive; $dW^{**}$ is a value of an X intercept that is obtained by extrapolating the characteristic curve; f is the slope of the characteristic curve at the virtual point; $DW^*$ is an X coordinate value at the virtual point; and a prime is the first-order differentiation of $V_{gtWi}$.

According to a fourth aspect, the characteristic evaluation apparatus of the second aspect is characterized in that the threshold voltage determination means determines the optimum second to fourth estimated values from a relational expression:

$$F(\delta, V_{gtWi}) = \frac{f^2(\delta, V_{gtWi})}{f'(\delta, V_{gtWi})} \cdot dW^{**\prime}(\delta, V_{gtWi}) - G_m^*(\delta, V_{gtWi})$$

where $\delta$ is a difference between an estimated value of the threshold voltage of the second transistor, i.e., a first estimated value, and the threshold voltage of the first transistor; $V_{gtWi}$ is the first gate overdrive; $dW^{**}$ is a value of an X intercept that is obtained by extrapolating the characteristic curve; f is the slope of the characteristic curve at the virtual point; $G_m^*$ is a Y coordinate value at the virtual point; and a prime is the first-order differentiation of $V_{gtWi}$.

According to a fifth aspect, the characteristic evaluation apparatus of the second aspect is characterized in that the threshold voltage determination means determines the optimum second to fourth estimated values from a relational expression:

$$F(\delta, V_{gtWi}) = G_m^{}(\delta, V_{gtWi}) - \frac{f(\delta, V_{gtWi})}{f'(\delta, V_{gtWi})} \cdot G_m^{\prime}(\delta, V_{gtWi}) - G_m^*(\delta, V_{gtWi})$$

where $\delta$ is a difference between an estimated value of the threshold voltage of the second transistor, i.e., a first estimated value, and the threshold voltage of the first transistor; $V_{gtWi}$ is the first gate overdrive; $G_m^{**}$ is a value of a Y intercept that is obtained by extrapolating the characteristic curve; f is the slope of the characteristic curve at the virtual point; $G_m^*$ is a Y coordinate value at the virtual point; and a prime is the first-order differentiation of $V_{gtWi}$.

According to a sixth aspect, the characteristic evaluation apparatus of the second aspect is characterized in that the threshold voltage determination means determines the optimum second to fourth estimated values from a relational expression:

$$F(\delta, V_{gtWi}) = \frac{G_m^{**\prime}(\delta, V_{gtWi})}{f'(\delta, V_{gtWi})} + DW^*(\delta, V_{gtWi})$$

where $\delta$ is a difference between an estimated value of the threshold voltage of the second transistor, i.e., a first estimated value, and the threshold voltage of the first transistor; $V_{gtWi}$ is the first gate overdrive; $G_m^{**}$ is a value of a Y intercept that is obtained by extrapolating the characteristic curve; f is the slope of the characteristic curve at the virtual point; $DW^*$ is an X coordinate value at the virtual point; and a prime is the first-order differentiation of $V_{gtWi}$.

According to a seventh aspect, a characteristic evaluation apparatus for insulated gate type transistors in which at least two insulated gate type transistors that differ from each other only in mask channel width are used for evaluation and the characteristic of a first insulated gate type transistor having a wide mask channel width serves as a reference, to evaluate the characteristic of a second insulated gate type transistor having a narrow mask channel width. This apparatus comprises: a threshold voltage estimation means that extracts the threshold voltage of the first transistor, estimates the threshold voltage of the second transistor, and employs a value as estimated, as a first estimated value; an extraction means in which (i) a difference between a gate voltage of the first transistor and the threshold voltage of the first transistor is defined as a first gate overdrive, and a difference between a gate voltage of the second transistor and the first estimated value is defined as a second gate overdrive, (ii) in an X-Y plane whose X-axis is the mask channel width and Y-axis is source-drain conductance, a virtual point at which a change in Y coordinate value is estimated to be approximately zero when the first and second gate overdrives are finely changed from a first characteristic curve exhibiting a relationship between the mask channel widths of the first and second transistors and the source-drain conductance, and (iii) a value of the X coordinate at the virtual point is employed as a second estimated value, alternatively, as a value of the X intercept of the first characteristic curve; a threshold voltage determination means in which (i) from the second estimated value, an optimum first estimated value is found with which a second characteristic curve exhibiting a relationship between the second gate overdrive and the second estimated value in an X-Y plane whose X-axis is the second gate overdrive and Y-axis is a value related to the second estimated value, has a predetermined shape within a predetermined range of the second gate overdrive, and (ii) the optimum first estimated value is determined as a true threshold voltage of the second transistor; and a channel narrowing determination means that determines a difference between the mask channel width and an effective channel width, based on the true threshold voltage.

According to an eighth aspect, the characteristic evaluation apparatus of the seventh aspect is characterized in that the extraction means further employs a value of the X intercept of the first characteristic curve as a third estimated value; and the threshold voltage determination means employs a value that is obtained by reducing the second estimated value from twice the third estimated value, as the value related to the second estimated value.

According to a ninth aspect, the characteristic evaluation apparatus of the eighth aspect is characterized in that the threshold voltage determination means employs the first estimated value with which a value that is obtained by reducing the second estimated value from twice the third estimated value is best converged on a fixed value in the predetermined range, as the optimum first estimated value.

According to a tenth aspect, the characteristic evaluation apparatus of the first aspect is characterized in that the channel narrowing determination means determines a difference between the mask channel width and an effective channel width, from a value that is obtained by reducing the second estimated value from twice the third estimated value when the gate overdrive is in the vicinity of 0 V.

According to an eleventh aspect, a characteristic evaluation apparatus for insulated gate type transistors in which at least two insulated gate type transistors that differ from each other only in mask channel width are used for evaluation and the characteristic of a first insulated gate type transistor having a wide mask channel width serves as a reference, to evaluate the characteristic of a second insulated gate type transistor having a narrow mask channel width. This apparatus comprises: a threshold voltage estimation means that extracts a threshold voltage of the first transistor, estimates the threshold voltage of the second transistor, and employs a value as estimated, as a first estimated value; an extraction means in which (i) a difference between a gate voltage of the first transistor and the extracted threshold voltage of the first transistor is defined as a first gate overdrive, and a difference between a gate voltage of the second transistor and the first estimated value is defined as a second gate overdrive, (ii) under the condition that the first and second gate overdrives are the same in an X-Y plane whose X-axis is the mask channel width and Y-axis is source-drain resistance, a virtual point at which a change in Y coordinate value is estimated to be approximately zero even if the first and second gate overdrives are finely changed, is extracted from points on a straight line passing through a first point whose X coordinate is the mask channel width of the first transistor and Y coordinate is the source-drain resistance of the second transistor, and a second point whose X coordinate is the mask channel width of the second transistor and Y coordinate is the source-drain resistance of the first transistor, (iii) values of the X coordinate and Y coordinate at the virtual points are defined as second and third estimated values, respectively, and (iv) a slope of the straight line at the virtual points is extracted and a value of the slope is employed as a fourth estimated value; a threshold voltage determination means that determines a true threshold voltage of the second transistor by using the first to fourth estimated values; and a channel narrowing determination means that determines a difference between the mask channel width and an effective channel width, based on the true threshold voltage.

According to a twelfth aspect, in the characteristic evaluation apparatus of the eleventh aspect the threshold voltage determination means is characterized in: (i) finding, from the second to fourth estimated values, optimum second to fourth estimated values with which a change of the third estimated value is equal to the product of a change of the second estimated value and the fourth estimated value, in reply to fine changes of the first and second gate overdrives, (ii) determining an optimum first estimated value that corresponds to the optimum second to fourth estimated values, and (iii) determining the true threshold voltage of the second transistor, based on the optimum first estimated value.

According to a thirteenth aspect, the characteristic evaluation apparatus of the twelfth aspect is characterized in that the threshold voltage determination means determines the optimum second to fourth estimated values from a relational expression:

$$F(\delta, V_{gtWi}) = \frac{h^2(\delta, V_{gtWi})}{h'(\delta, V_{gtWi})} \cdot dW^{**\prime}(\delta, V_{gtWi}) - R^{\#}(\delta, V_{gtWi})$$

where δ is a difference between an estimated value of the threshold voltage of the second transistor, i.e., a first estimated value, and the threshold voltage of the first transistor; $V_{gtWi}$ is the first gate overdrive; $dW^{**}$ is a value of an X intercept that is obtained by extrapolating the straight line; h is the slope of the straight line; $R^{\#}$ is a Y coordinate value at the virtual point; and a prime is the first-order differentiation of $V_{gtWi}$.

According to a fourteenth aspect, the characteristic evaluation apparatus of the twelfth aspect is characterized in that the threshold voltage determination means determines the optimum second to fourth estimated values from a relational expression:

$$F(\delta, V_{gtWi}) = R^{}(\delta, V_{gtWi}) - \frac{h(\delta, V_{gtWi})}{h'(\delta, V_{gtWi})} \cdot R^{\prime}(\delta, V_{gtWi}) - R^{\#}(\delta, V_{gtWi})$$

where δ is a difference between an estimated value of the threshold voltage of the second transistor, i.e., a first estimated value, and the threshold voltage of the first transistor; $V_{gtWi}$ is the first gate overdrive; $R^{**}$ is a value of a Y intercept that is obtained by extrapolating the straight line; h is the slope of the straight line; $R^{\#}$ is a Y coordinate value at the virtual point; and a prime is the first-order differentiation of $V_{gtWi}$.

According to a fifteenth aspect, the characteristic evaluation apparatus of the twelfth aspect is characterized in that the threshold voltage determination means determines the optimum second to fourth estimated values from a relational expression:

$$F(\delta, V_{gtWi}) = \frac{R^{**\prime}(\delta, V_{gtWi})}{h'(\delta, V_{gtWi})} + DW^{*}(\delta, V_{gtWi})$$

where δ is a difference between an estimated value of the threshold voltage of the second transistor, i.e., a first estimated value, and the threshold voltage of the first transistor; $V_{gtWi}$ is the first gate overdrive; $R^{**}$ is a value of a Y intercept that is obtained by extrapolating the straight line; h is the slope of the straight line; $DW^{\#}$ is an X coordinate value at the virtual point; and a prime is the first-order differentiation of $V_{gtWi}$.

According to a sixteenth aspect, the characteristic evaluation apparatus of the twelfth aspect is characterized in that the threshold voltage determination means determines the optimum second to fourth estimated values from a relational expression:

$$F(\delta, V_{gtWi}) = dW^{}(\delta, V_{gtWi}) + \frac{h(\delta, V_{gtWi})}{h'(\delta, V_{gtWi})} \cdot dW^{'}(\delta, V_{gtWi}) - DW^{\#}(\delta, V_{gtWi})$$

where $\delta$ is a difference between an estimated value of the threshold voltage of the second transistor, i.e., a first estimated value, and the threshold voltage of the first transistor; $V_{gtWi}$ is the first gate overdrive; $dW^{**}$ is a value of an X intercept that is obtained by extrapolating the straight line; h is the slope of the straight line; $DW^{\#}$ is an X coordinate value at the virtual point; and a prime is a first-order differentiation of $V_{gtWi}$.

According to a seventeenth aspect, in the characteristic evaluation apparatus of the eleventh aspect the threshold voltage determination means is characterized in (i) finding, in an X-Y plane whose X-axis is the second gate overdrive and Y-axis is the second estimated value, the optimum first estimated value with which a characteristic curve exhibiting the relationship between the second gate overdrive and the second estimated value has a predetermined shape in a predetermined range of the second gate overdrive, and (ii) determining the true threshold voltage of the second transistor, based on the optimum first estimated value.

According to an eighteenth aspect, the characteristic evaluation apparatus of the seventeenth aspect is characterized in that the threshold voltage determination means estimates, from the characteristic curve in plural, an optimum characteristic curve with which the second estimated value is best converged on a fixed value in the predetermined range.

At According to a nineteenth aspect, the characteristic evaluation apparatus of the eleventh aspect is characterized in that the channel narrowing determination means determines a difference between the mask channel width and an effective channel width, from the second estimated value when the gate overdrive is in the vicinity of 0 V.

The characteristic evaluation apparatus of the first or twelfth aspect allows accurate extraction of the threshold voltage of the second insulated gate type transistor, irrespective of the range of the second gate overdrive, thereby improving the accuracy of effective channel width extraction.

The characteristic evaluation apparatus of the eleventh aspect facilitates to determine the value of channel narrowing when the first and second gate overdrives are in the vicinity of zero because the stationary point of the second estimated value is present in the vicinity of zero.

The characteristic evaluation apparatus of the second aspect facilitates the slope extraction between virtual points because a characteristic curve is approximated to a straight line. This allows to find a virtual point as the intersection of straight lines, and the slope at an intersection as the slope of a straight line.

The characteristic evaluation apparatus of the third, fourth, fifth, sixth, thirteenth, fourteenth, fifteenth or sixteenth aspect requires no differentiation of the gate overdrive at a virtual point, thereby reducing errors.

The characteristic evaluation apparatus of the seventh, eighth or seventeenth aspect facilitates to determine true threshold voltages because the second characteristic curves that are obtained for the true threshold voltage on a graph may approximately coincide, irrespective of mask channel width.

The characteristic evaluation apparatus of the ninth or eighteenth aspect facilitates programming for appropriate results by detecting an optimum characteristic curve exhibiting the best convergence on a fixed value.

The characteristic evaluation apparatus of the tenth or nineteenth aspect facilitates channel narrowing determination because the channel narrowing at the gate overdrive of 0 V is determined by using a value that is obtained by reducing the second estimated value from twice the third estimated value, alternatively, because the second estimated value has a stationary point when the gate overdrive is in the vicinity of 0 V.

To solve the above problem, it is an object of the present invention to obtain a characteristic evaluation apparatus for insulating gate type transistors which performs evaluation of insulated gate type transistors by using a characteristic evaluation method for insulated gate type transistors which reduces the error due to the uncertainty of a threshold voltage to permit channel narrowing extraction of high accuracy.

It is another object of the present invention to obtain a computer readable storing medium that stores a characteristic evaluation program.

It is another object of the present invention to obtain a manufacturing method by which insulated gate type transistors having excellent characteristics can be manufactured easily by using the above characteristic evaluation method.

These and other objects, features, aspects and advantages of the present invention will become more apparent from the following detailed description of the present invention when taken in conjunction with the accompanying drawings.

BRIEF DESCRIPTION OF THE DRAWINGS

FIG. 24 is a graph for explaining the outline of a fourth preferred embodiment;

DESCRIPTION OF THE PREFERRED EMBODIMENTS

First Preferred Embodiment

A characteristic evaluation method for insulated gate type transistors according to a first preferred embodiment will be described hereafter. In this method, a channel narrowing DW is extracted by using the drain current in the linear areas of a plurality of transistors, each having the same mask channel length $L_m$ and a different mask channel width $W_m$.

Figure 1:
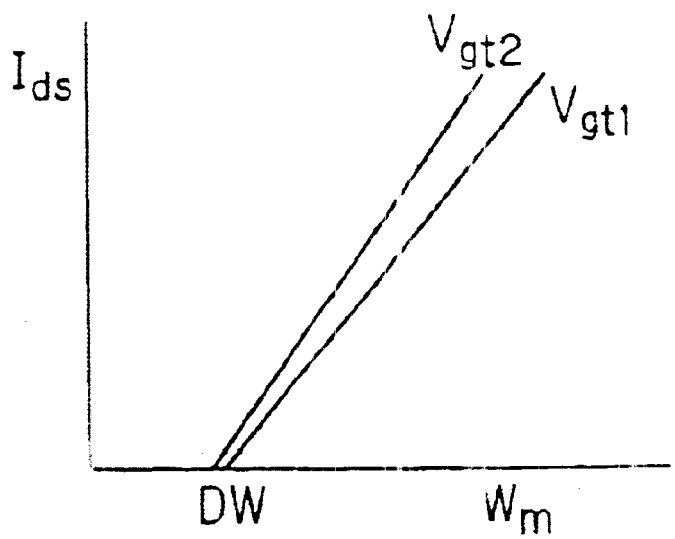
FIG. 1 is a graph for explaining an effective channel length extraction by Chia method.
Figure 2:
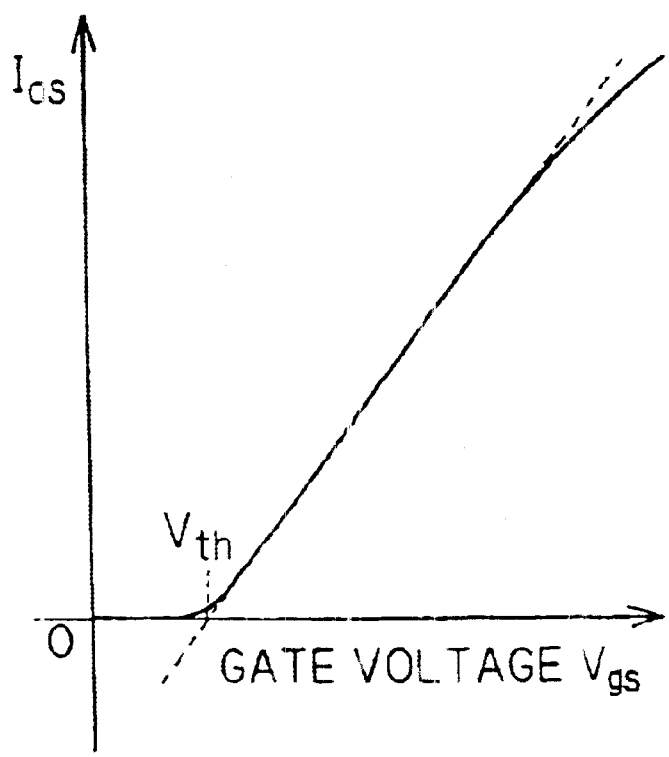
FIG. 2 is a graph for explaining threshold voltage extraction.

The above characteristic evaluation method will be roughed out. Firstly there are prepared at least two MOS transistors, each having the same channel length $L_m$ and a different mask channel width $W_m$. In the following description, the number of MOS transistors is limited to two. Of the two MOS transistors, one having a wide mask channel width $W_m$ is referred to as a wide transistor or first insulated gate type transistor, and the other having a narrow mask channel width $W_m$ is referred to as a narrow transistor or second insulated gate type transistor. Subscript Wi in symbols stands for being concerned with the wide transistor, and subscript Na stands for being concerned with the narrow transistor. In the prior art method that is described by referring to FIG. 2, the threshold voltages $V_{thWi}$, $V_{thNa}$ of the wide transistor and narrow transistor, respectively, are extrapolated from $I_{ds}$-$V_{gs}$ characteristic or the like. The threshold voltage $V_{thNa}$ of the second insulated gate type transistor thus obtained is a first estimated value. By changing the threshold voltage $V_{thNa}$ of the narrow transistor (the first estimated value) with the threshold voltage $V_{thWi}$ of the wide transistor fixed, a coordinate (DW*, $G_m$*) at a virtual point at which the change in source-drain conductance is estimated to be approximately zero even if a gate overdrive $V_{gt}$ is finely changed against each of the changed threshold voltage $V_{thNa}$, is extracted from, for example, the intersection coordinates of a plurality of characteristic curves having a different gate overdrive $V_{gt}$. In this case, the gate overdrive $V_{gt}$ of the wide transistor is a first gate overdrive, and the gate overdrive $V_{gt}$ of the narrow transistor is a second gate overdrive. The coordinate DW*, coordinate $G_m$* and slope f at the virtual point are second, third and fourth estimated values, respectively.

Figure 3:
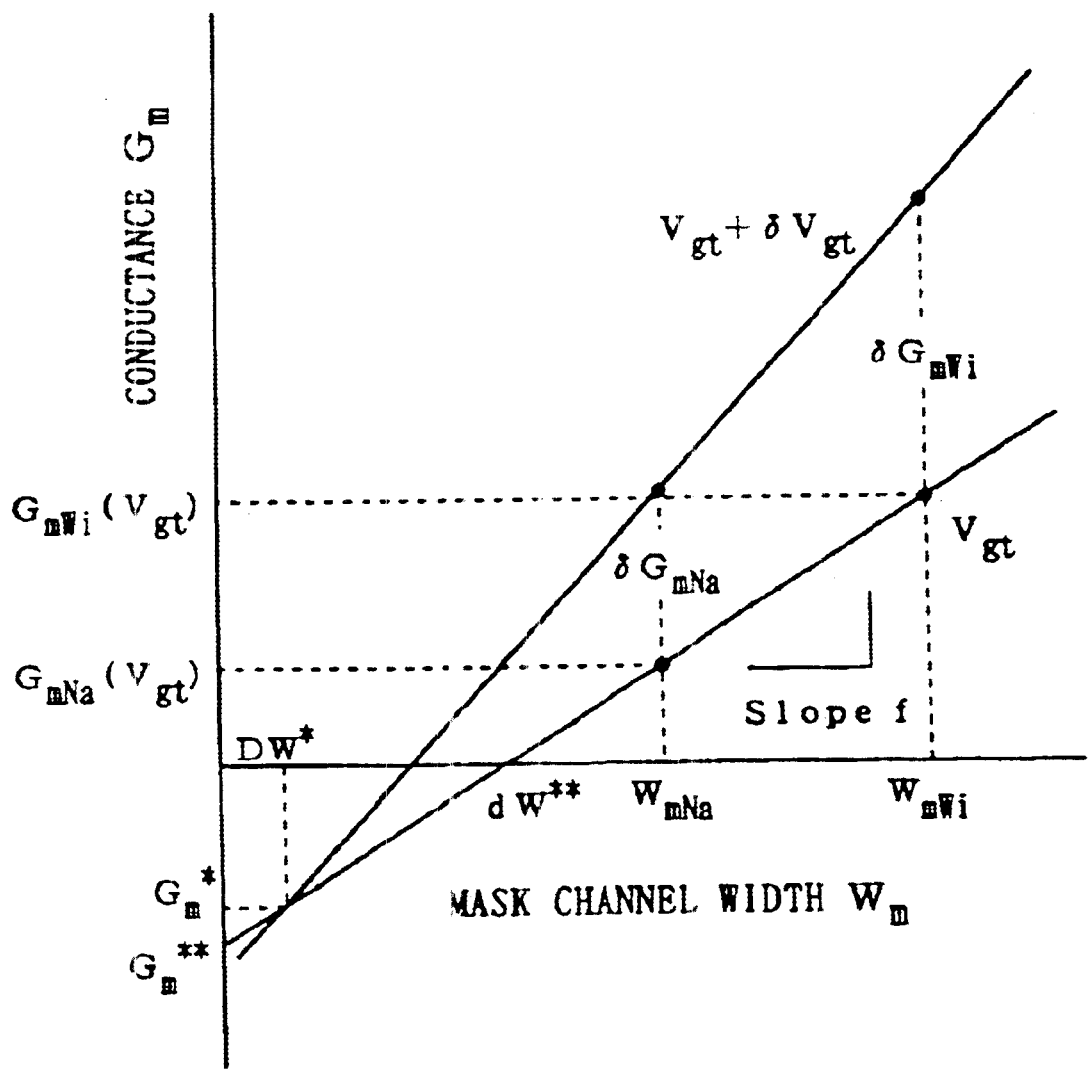
FIG. 3 is a graph for explaining a virtual point, $G_m$ intercept and $W_m$ intercept in Gm method.

Then, by using the threshold voltages $V_{thWi}$ and $V_{thNa}$, the coordinate (DW*, $G_m$*) at the virtual point is extracted from the relationship between conductance $G_m$ and mask channel width $W_m$. Examples of this method is, as shown in FIG. 3 in prior art, one in which two characteristic curves (straight lines) representing the characteristic $G_m$-$W_m$ are drawn in a graph whose X-axis is mask channel width $W_m$ and Y-axis is source-drain conductance $G_m$, and the intersection of the two straight lines is found to extract a virtual point. In FIG. 3, the straight line expressing the gate overdrive $V_{gt}$ is a first straight line, the point that satisfies the mask channel width $W_m$=$W_{mWi}$ on the first straight line is a first point, and the point that satisfies the mask channel width $W_m$=$W_{mNa}$ on the first straight line is a second point. However, the estimation of the coordinate at a virtual point is not limited to the above. Instead of a straight line passing through two points, a curve to be determined by three or more points may be used. Alternatively, a point in the vicinity of an intersection may be used instead of the intersection. From among the values of a coordinate (DW*, $G_m$*) which express the extracted virtual point, there is determined the value with which the change in the value $G_m$ of the Y component of the coordinate expressing a virtual point is estimated to be equal to the product of the change of the value DW* of the X component of the virtual point and the channel resistance value f per unit width.

Extraction of an effective channel width $W_{eff}$ in MOS transistors will be described in detail by referring to FIG. 4.

Firstly, the $I_{ds}$-$V_{gs}$ characteristics of two transistors Wi and Na, each having the same mask channel length $L_m$ and a different mask channel width $W_m$, are measured (step ST1.1).

From the obtained $I_{ds}$-$V_{gs}$ characteristics, the threshold voltages $V_{thWi}$ of a wide transistor and $V_{thNa}$ of a narrow transistor are extracted by using extrapolation method or the like (step ST1.2). Then, the difference ($V_{thNa}$-$V_{thWi}$) between the threshold voltages $V_{thWi}$ and $V_{thNa}$ is found. Hereafter, the difference ($V_{thNa}$-$V_{thWi}$) thus found is defined as $\delta_{guess}$.

The lower and upper limits of an area in which the value δ to be set as a threshold voltage difference is changed are determined as $\delta_{inf}$=$\delta_{guess}$-K, and $\delta_{sup}$=$\delta_{guess}$+K, respectively (step ST1.3). Here, let K be 0.2 V, and δ=$\delta_{inf}$ is set as an initial value.

Then, it is determined whether the value δ to be calculated is present between $\delta_{inf}$ and $\delta_{sup}$(step ST1.4). That is, it is determined whether $\delta_{inf} \leq \delta \leq \delta_{sup}$.

When the value δ is present between $\delta_{inf}$ and $\delta_{sup}$, the threshold voltage $V_{thWi}$ of the wide transistor is fixed to the value that has been extracted in step ST1.2, and the threshold voltage $V_{thNa}$ of the narrow transistor is supposed to be the sum of the threshold voltage $V_{thWi}$ of the wide transistor and the δ (step ST1.5).

On the basis of the threshold voltage $V_{thWi}$ and $V_{thWi}+\delta$ in step ST1.5, a gate overdrive $V_{gt}$ is measured. For about 20 points in a certain area Ω, e.g., in the range of the gate overdrive $V_{gt}$ satisfying 0.3 V ≤ $V_{gt}$ < 1.3 V, there are found the rate of change $DW^{*\prime}(\delta, V_{gtn})$ in the value of $W_m$ coordinate at a virtual point, the rate of change $G_m^{*\prime}(\delta, V_{gtn})$ in the value of $G_m$ coordinate at a virtual point, and the conductance $f(\delta, V_{gtn})$ per unit width. From the values thus found, the value of function $F(\delta, V_{gtn})$ expressed by Equation 6 is found.

$$F(\delta, V_{gtn}) = G_m^{*\prime} - f \cdot DW^{*\prime}$$

where $$n = 1, 2, \ldots 20. \quad \text{(Eq. 6)}$$

Next, the standard deviation of function F, σ[F(δ)], is calculated in the area Ω (step ST1.7). By substituting δ+Q for δ, the value of a shift amount δ is changed to return to step ST1.4 (step ST1.8). Let the value of Q be 0.01, for example.

When it is determined $\delta_{inf} \leq \delta \leq \delta_{sup}$ in step ST1.4, steps ST1.5 to ST1.8 are repeated. On the other hand, when it is not determined $\delta_{inf} \leq \delta \leq \delta_{sup}$ in step ST1.4, it goes to step ST1.9 and find $\delta = \delta_0$, with which the standard deviation σ[F(δ)] becomes a minimum. At that time, the true threshold voltage $V_{thNa}$ of the narrow transistor is given by the sum of the threshold voltage $V_{thWi}$ of the wide transistor and the $\delta_0$ that has been determined in step ST1.9.

Using the true threshold voltage $V_{thWi}+\delta_0$ of the narrow transistor that has been determined in step ST1.9, the gate overdrive $V_{gt}$ of the narrow transistor is measured to find the value $DW^*(V_{gt})$ of $W_m$ coordinate at a virtual point (step ST1.10). The threshold voltage $V_{thWi}$ of the wide transistor at that time is based on the value that has been found in step ST1.2, as in step ST1.5.

Let the channel narrowing $DW_{Na}$ of the narrow transistor be $DW_{Na}(V_{gt}) = dW^{}(V_{gt})$, where $dW^{}$ is an optimum second estimated value (step ST1.11). At the same time an effective channel width $W_{effNa}$ is given by the following Equation 7. Hereat, $G_m^*$ that is obtained by using a gate overdrive $V_{gt}$ providing a channel narrowing DW is an optimum third estimated value. Further, an optimum fourth estimated value is the conductance f of the channel per unit width which is obtained by using a gate overdrive $V_{gt}$ providing a channel narrowing DW.

$$W_{effNa}(V_{gt}) = W_{mNa} - DW_{Na}(V_{gt}) \quad \text{(Eq. 7)}$$

Although in step ST1.11, the channel narrowing $DW_{Na}$ is determined from $dW^{}$, the channel narrowing $DW(V_{gt})$ when a gate overdrive $V_{gt}$ is in the vicinity of zero may be determined as a value (2·$dW^{}$−$DW^*$), which is given from $W_m$ coordinate at an intersection and $W_m$ intercept. In this case, when the gate overdrive $V_{gt}$ is in the vicinity of zero, the change of (2·$dW^{**}$−$DW^*$) against the change of gate overdrive $V_{gt}$ is extremely small, thus making it easy to determine a channel narrowing $DW_{Na}$.

Description will be now given of a concrete procedure to determine a channel narrowing DW and the like, from the standard deviation of the function F shown in Equation 6. In a characteristic evaluation method for insulated gate type transistors according to the first preferred embodiment, to reduce the uncertainty of threshold voltage extrapolation and, in particular, the error due to the uncertainty of threshold voltage extrapolation for transistors having a narrow channel width, the relationship of Equation 8 which is, for example, established between the value $DW^*$ of $W_m$ coordinate at a virtual point and the value $dW^{}$, is noted to apply a variation method. Here, $dW^{}$ is the value of X intercept that is obtained by extrapolating a $G_m$-$W_m$ characteristic curve (straight line) which is plotted between source-drain conductance $G_m$ and mask channel width $W_m$, by using $G_m$ to enter a Y-axis and $W_m$ to enter an X-axis. Hereinafter, $dW^{**}$ may be taken to represent the value of $W_m$ intercept.

$$dW^{} + \frac{f}{f'} dW^{\prime} - DW^* = 0 \quad \text{(Eq. 8)}$$

Supposing that the threshold voltage difference between the narrow transistor and the wide transistor is a shift amount δ, the value $DW^*$ of $W_m$ coordinate at a virtual point, the value $dW^{}$ of $W_m$ intercept and its rate of change $dW^{\prime}$, as well as the channel conductance f per unit width and its rate of change f', are found from $G_{mNa}(V_{gtWi}+\delta-V_{thNa}+V_{thWi})$ and $G_{mWi}(V_{gtWi})$. When a shift amount δ is equal to the true threshold voltage difference $\delta_0$ between the narrow transistor and the wide transistor, Equation 8 is satisfied. At that time, $dW^{**}$ gives a channel narrowing DW. Therefore, a channel narrowing DW can be extracted through the following procedure.

Firstly, with respect to a certain shift amount δ, the value $DW^*$ of $W_m$ coordinate at a virtual point, the value $dW^{**}$ of $W_m$ intercept, and the channel conductance f per unit width are given by Equations 9 to 11.

$$DW^* = \frac{W_{mNa} - ri \cdot W_{mWi}}{(1 - ri)} \quad \text{(Eq. 9)}$$

$$dW^{**} = \frac{W_{mNa} - rai \cdot W_{mWi}}{(1 - rai)} \quad \text{(Eq. 10)}$$

$$f(V_{gtWi}, \delta) = \frac{G_{mWi}(V_{gtWi}) - G_{mNa}(V_{thWi} + \delta - V_{gtNa} + V_{thWi})}{W_{mWi} - W_{mNa}} \quad \text{(Eq. 11)}$$

In Equations 9 to 11, parameters ri and rai are defined by the following Equations 12 and 13, respectively, and $V_{gtWi}$ denotes a gate overdrive on the basis of the threshold voltage $V_{thWi}$ of a wide transistor having a wide mask channel width $W_{mWi}$.

$$ri(V_{gtwi}, \delta) \equiv \frac{G'_{mNa}(V_{gtWi} + \delta - V_{thNa} + V_{thWi})}{G'_{mWi}(V_{gtWi})} \quad \text{(Eq. 12)}$$

$$rai(V_{gtwi}, \delta) \equiv \frac{G_{mNa}(V_{gtwi} + \delta - V_{thNa} + V_{thWi})}{G_{mWi}(V_{gtWi})} \quad \text{(Eq. 13)}$$

The value $DW^*$ of $W_m$ coordinate at a virtual point, the value $dW^{}$ of $W_m$ intercept and its rate of change $dW^{\prime}$, as well as the channel conductance f per unit width and its rate of change f', are found by changing a shift amount δ.

The function F in Equation 6 can be modified to redefine as the following Equation 14, making it easy to find the function F. When a shift amount δ is equal to a threshold voltage difference $\delta_0$ between the narrow transistor and the wide transistor, the function F defined in Equation 14 becomes zero, irrespective of a gate overdrive $V_{gtWi}$. Then, a shift amount $\delta$ with which the standard deviation of function F in an area of gate overdrive $V_{gtWi}$ becomes a minimum, is determined as a true threshold voltage difference $\delta_0$.

$$F(V_{gtWi}, \delta) = \qquad \text{(Eq. 14)}$$
$$dW^{}(V_{gtWi}, \delta) + \frac{f(V_{gtWi}, \delta)}{f'(V_{gtWi}, \delta)} \cdot dW^{\prime}(V_{gtWi}, \delta) - DW^{*}(V_{gtWi}, \delta)$$

Figure 5:
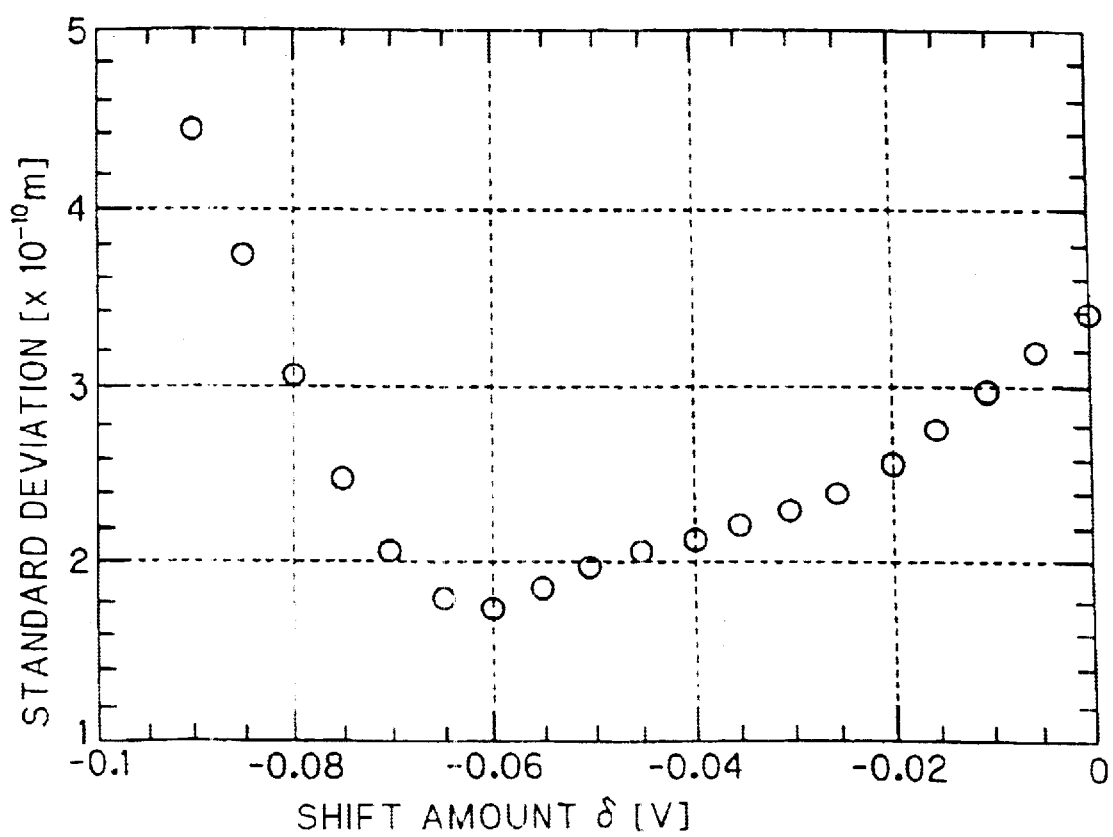
FIG. 5 is a graph for explaining a true shift amount determination according to the first preferred embodiment.

FIG. 5 is a graph showing one example of the relationship between the standard deviation of function F and shift amount $\delta$. In this graph, a minimum value is obtained when the shift amount $\delta$ is −0.06 V, thus let a true threshold voltage difference $\delta_0$ be −0.06 V.

Figure 6:
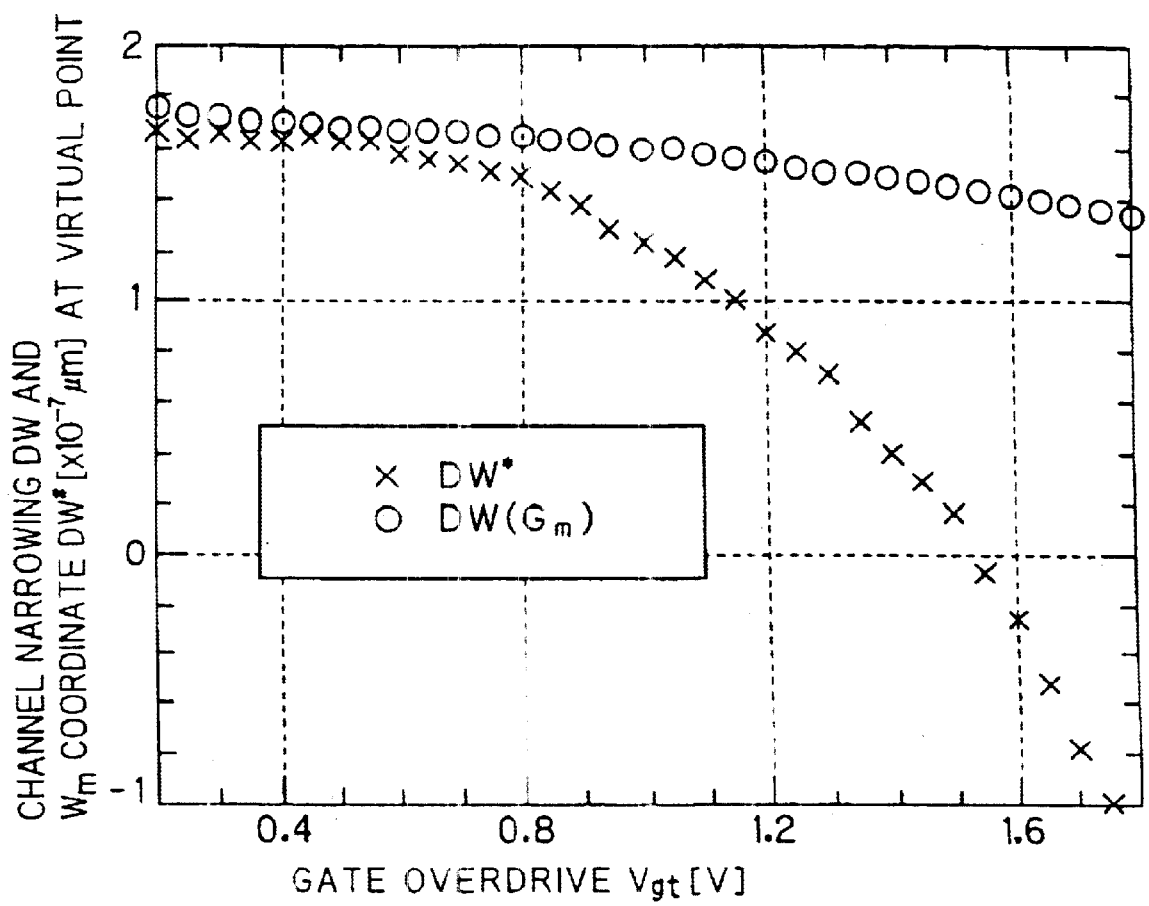
FIG. 6 is a graph for explaining the relationship between channel narrowing and $W_m$ coordinate at a virtual point.

The value of a channel narrowing DW is determined by using the value of the above threshold voltage difference $\delta_0$. For instance, it may be determined in the same manner as in step ST1.11 of FIG. 4. Alternatively, the average of values obtained when the gate overdrive $V_{gt}$ is in the vicinity of zero, among the values $DW^{*}(\delta_0, V_{gt})$ of $W_m$ coordinate at a virtual point, may be taken as the value of a channel narrowing DW. FIG. 6 gives an example of the results when the characteristic evaluation method of MOS transistors according to the first preferred embodiment (hereinafter referred to as Gm method) is applied to a process.

Instead of Equation 14 that is used in the first preferred embodiment, any one of Equations 15 to 17 may be used to find function F.

$$F(\delta, V_{gtWi}) = \frac{f^2(\delta, V_{gtWi})}{f'(\delta, V_{gtWi})} \cdot dW^{**}(\delta, V_{gtWi}) - G_m^{*}(\delta, V_{gtWi}) \qquad \text{(Eq. 15)}$$

$$F(\delta, V_{gtWi}) = \qquad \text{(Eq. 16)}$$
$$G_m^{}(\delta, V_{gtWi}) - \frac{f(\delta, V_{gtWi})}{f'(\delta, V_{gtWi})} \cdot G_m^{\prime}(\delta, V_{gtWi}) - G_m^{*}(\delta, V_{gtWi})$$

$$F(\delta, V_{gtWi}) = \frac{G_m^{**\prime}(\delta, V_{gtWi})}{f'(\delta, V_{gtWi})} + DW^{*}(\delta, V_{gtWi}) \qquad \text{(Eq. 17)}$$

In Equations 16 and 17, $G_m^{}$ is the value of a R intercept that is obtained by extrapolating $G_m$–$W_m$ characteristic. Thus, by using mask channel width $W_m$ to enter the X-axis and source-drain conductance $G_m$ to enter the Y-axis, without using any coordinate at a virtual point, a $G_m$–$W_m$ characteristic curve (straight line) is extrapolated to obtain the value $G_m^{}$ of a Y intercept and the value $dW^{}$ of a Y intercept which are found as X=0 and Y=0, respectively. The use of the value $G_m^{}$ or $dW^{**}$ requires no differentiation of the coordinate $(DW^{*}, R^{*})$ at a virtual point. The accuracy is unchanged by using any one of Equations 14 to 17. Equation 15 and 16, however, call for calculation of $G_m^{**}$. Hence, Equation 14 or 17 is preferred.

Although in the first preferred embodiment, a shift amount $\delta$ is determined by a value with which the standard deviation of function F becomes a minimum, it can be determined by a value with which the average value of functions F approaches zero, or the minimum value of the sum of squares($\Sigma F^2$) of function F. The above alternatives, however, might have the errors due to the offset of the value of function F, which are caused by calculation errors, unlike the value with which the standard deviation becomes a minimum.

Figure 7:
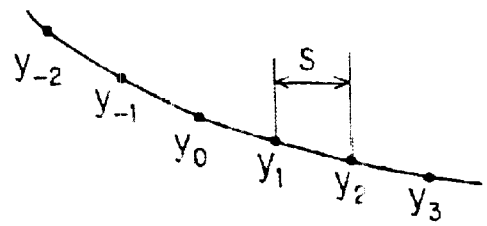
FIG. 7 is a diagram for explaining a higher-order narrowing.

Moreover, the first preferred embodiment employs $G_{mNa}'/G_{mWi}'$ in Equation 12, for example, to improve calculation accuracy in finding the value $DW^{*}$ of $W_m$ coordinate at a virtual point. On the other hand, if easy process is desired, a higher accuracy calculation than prior art is attainable by using $\delta$ $G_{mNa}/\delta$ $G_{mWi}$, instead of $G_{mNa}'/G_{mWi}'$. High-accuracy channel narrowing DW extraction is also attainable by high-accuracy calculation of the change in the source-drain conductance $G_m$ of a wide transistor or narrow transistor, by means of a higher-order approximate expression. For instance, the slope of a curve at $y_0$ among points that are equally spaced with a width s, as shown in FIG. 7, can be given by a higher-order approximate expression in the following Equation 18.

$$y_0' = \frac{1}{12 \cdot h}(y_{-2} - 8 \cdot y_{-1} + 8 \cdot y_1 - y_2) \qquad \text{(Eq. 18)}$$

The use of the characteristic evaluation method for insulated gate type transistors in the first preferred embodiment permits evaluation at higher accuracy than prior art. As a result, improvement of accuracy owing to use of $G_{mNa}'/G_{mWi}'$ is satisfactorily reflected on evaluation results than prior art.

In the calculation of $G_{mNa}'/G_{mWi}'$ by Gm method, to reduce errors, resistance R is sometimes used instead of conductance $G_m$, as shown in Equation 19. The reason for using the differentiation of the logarithm of resistance R is to reduce the error due to a great change in resistance R when $V_{gt}$ is brought near zero.

$$\frac{G_{mNa}'}{G_{mWi}'} = \frac{(1/R_{Na})'}{(1/R_{Wi})'} = \frac{R_{Na}'}{R_{Wi}'} \cdot \frac{R_{Wi}^2}{R_{Na}^2} = \frac{(\ln R_{Na})'}{(\ln R_{Wi})'} \cdot \frac{R_{Wi}}{R_{Na}} \qquad \text{(Eq. 19)}$$

Figure 8:
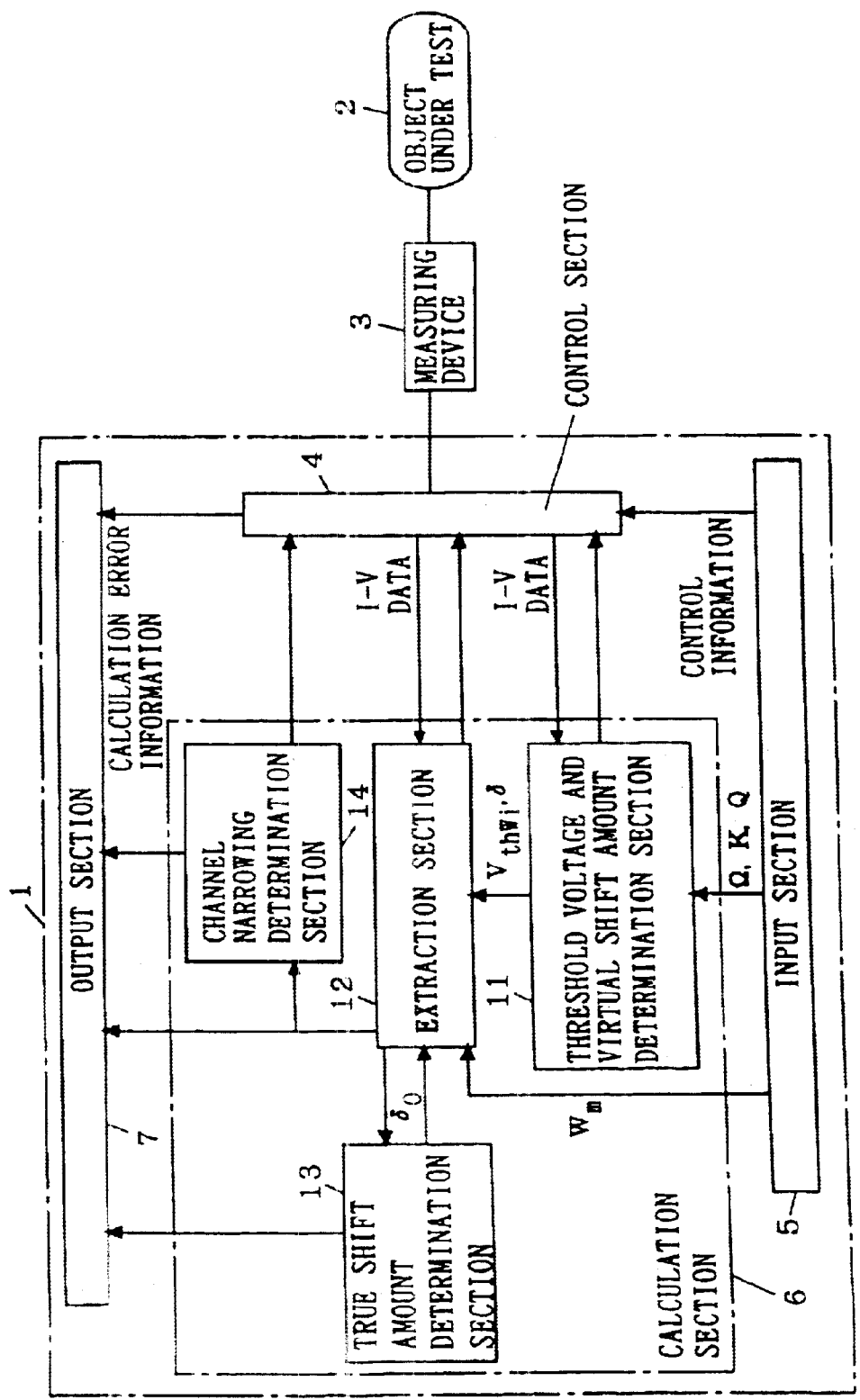
FIG. 8 is a block diagram giving an example of the construction of a characteristic evaluation apparatus for insulated gate type transistors according to the first preferred embodiment.

Description will be now given of a characteristic evaluation apparatus for insulated gate type transistors according to the first preferred embodiment, by referring to FIG. 8. A characteristic evaluation apparatus for insulated gate type transistors 1 is connected to a measuring device 3 for measuring an object under test 2. Examples of the object under test 2 are integrated circuits in which a wide transistor and a narrow transistor are formed. Such an integrated circuit after being extracted from the lot for which all manufacturing steps have been terminated, is set to the measuring device 3 to make measurement therefor. The measuring device 3 is controlled by a control section 4 of the characteristic evaluation apparatus 1. An input section 5 provides the control section 4 with control information. The input section 5 is composed of a keyboard, a mouse and the like. Measurement data obtained in the measuring device 3 is inputted to a calculation section 6 together with the control information, through the control section 4. The calculation section 6 extracts an effective channel width $W_{eff}$, based on the data to be inputted from the input section 5. An output section 7 outputs the extracted effective channel width $W_{eff}$ and the control information used in the middle of extraction. Such control information is provided from the control section 4 or calculation section 5.

The calculation section 6 is composed of a threshold voltage and virtual shift amount determination section 11 that determines threshold voltages $V_{thWi}$, $V_{thNa}$, and virtual shift amount $\delta$; an extraction section 12 that extracts an intersection coordinate $(DW^{*}, G_m^{*})$ as the coordinate at a virtual point, and the slope f of a characteristic curve at the intersection coordinate; a true shift amount determination section 13 for determining a true shift amount $\delta_0$, and a channel narrowing determination section 14 for determining a channel narrowing DW (or an effective channel width $W_{eff}$). Although in this embodiment, an intersection coordinate is used as the coordinate at a virtual point at which the change of source-drain conductance $G_m$ is supposed to be approximately zero even if the gate overdrive $V_{gt}$ is finely changed in a $W_m$–$G_m$ characteristic curve. The intersection coordinate may be found by other than the method of finding an intersection, alternatively, other point may be used as the coordinate at a virtual point, as previously discussed. For executing calculation in the calculation section 6, the value of a variable K for determining the upper limit $\delta_{sup}$ and lower limit $\delta_{inf}$ in the range of changing a shift amount $\delta$, the range of area $\Omega$ in which a gate overdrive $V_{gt}$ is measured, and the quantity of change Q of a virtual shift amount $\delta$, are inputted to the threshold voltage and virtual shift amount determination section 11 from the input section 5. The measurement data of source-drain current $I_{ds}$ and gate-source voltage $V_{gt}$ are provided to the threshold voltage and virtual shift amount determination section 11, from the control section 4. The determination section 11 receives the above data, and then provides the extraction section 12 with the threshold voltage $V_{thWi}$ of a wide transistor and a virtual shift amount $\delta$ that indicates the difference between this threshold voltage $V_{thWi}$ and the threshold voltage $V_{thNa}$ of a narrow transistor. In the extraction section 12, with respect to each shift amount $\delta$, the rate of change $dDW^*/dV_{gt}$ and that of $dG_m/dV_{gt}$ for an intersection coordinate $(DW^*, G_m^*)$ in an area $\Omega$, and the slope f of a characteristic curve are extracted by using the value of the mask channel width $W_m$ provided from the input section 5, as well as the source-drain current $I_{ds}$ and the measurement data of gate-source voltage $V_{gt}$. From the rate of change $dDW^*/dV_{gt}$ of $W_m$ coordinate of the intersection, the rate of change $dG_m/dV_{gt}$ of R coordinate of the intersection, and the slope f of the characteristic curve which have been extracted in the extraction section 12, the true shift amount determination section 13 determines a virtual shift amount $\delta_0$ with which the standard deviation of the function F expressed in Equation 6 becomes a minimum in an area $\Omega$. Upon determination of a virtual shift amount $\delta_0$, the extraction section 12 outputs the virtual shift amount $\delta_0$ and the value $DW^*$ of $W_m$ coordinate of the corresponding intersection or the value $dW^{}$ of $W_m$ intercept, to a channel narrowing determination section 14. In the section 14, a channel narrowing DW is determined from the value $dW^{}$ of $W_m$ intercept or the value $DW^*$ of $W_m$ coordinate at a virtual point, and the calculation expressed in Equation 7 is carried out to determine an effective channel width $W_{eff}$. The output section 7 outputs the channel narrowing DW and the effective channel width $W_{eff}$ determined in the channel narrowing determination section 14, the intersection coordinate $(DW^*, G_m^*)$ and the slope of a characteristic curve at the intersection coordinate extracted in the extraction section 12, and the true shift amount $\delta_0$ determined in the true shift amount determination section 13.

With the above construction, it is possible to obtain a characteristic evaluation apparatus for insulated gate type transistors which extracts an effective channel width $W_{eff}$ at a higher accuracy than prior art.

Figure 4:
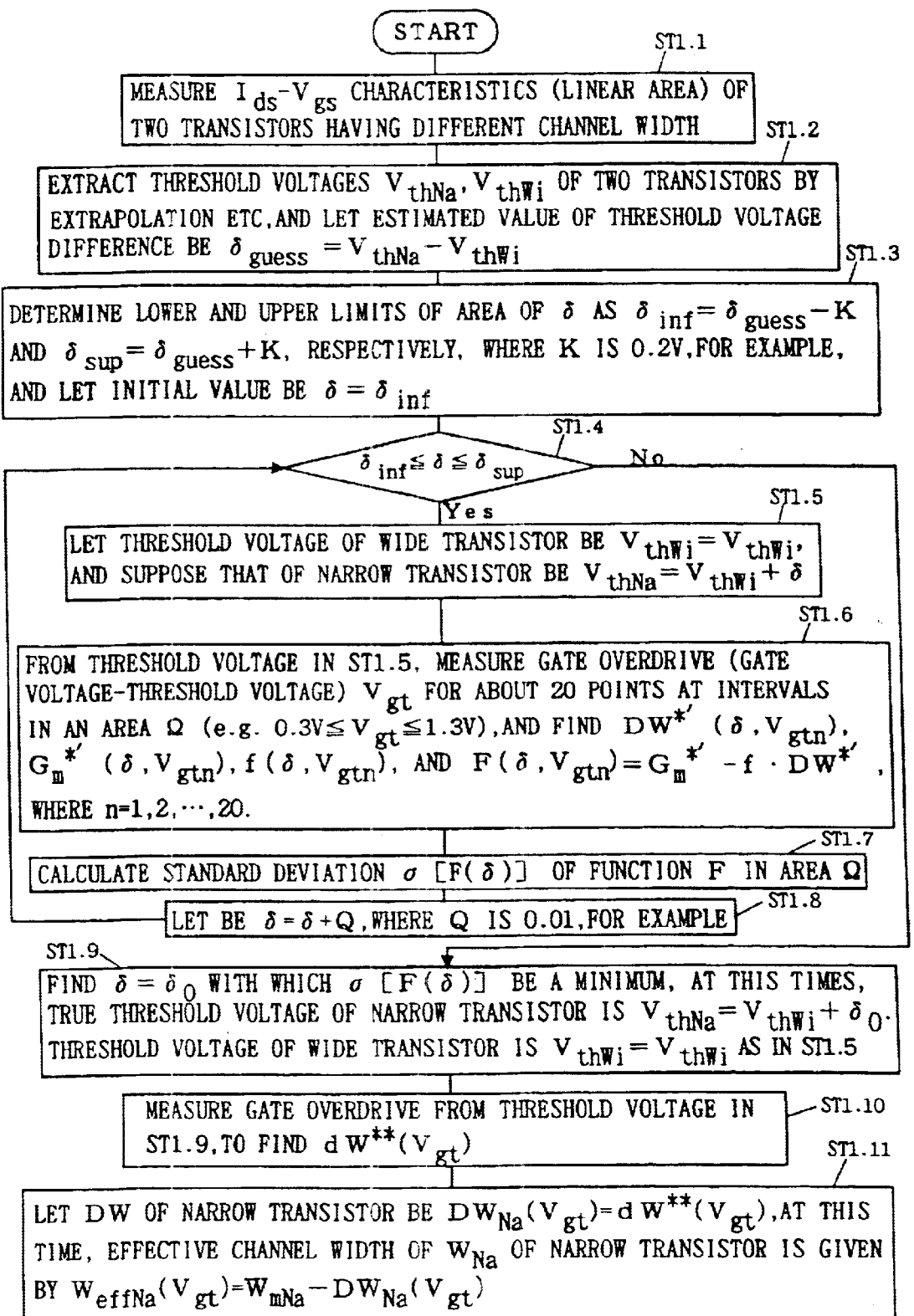
FIG. 4 is a flowchart giving an example of the procedure of a characteristic evaluation method for insulated gate type transistors according to a first preferred embodiment of the present invention.
Figure 9:
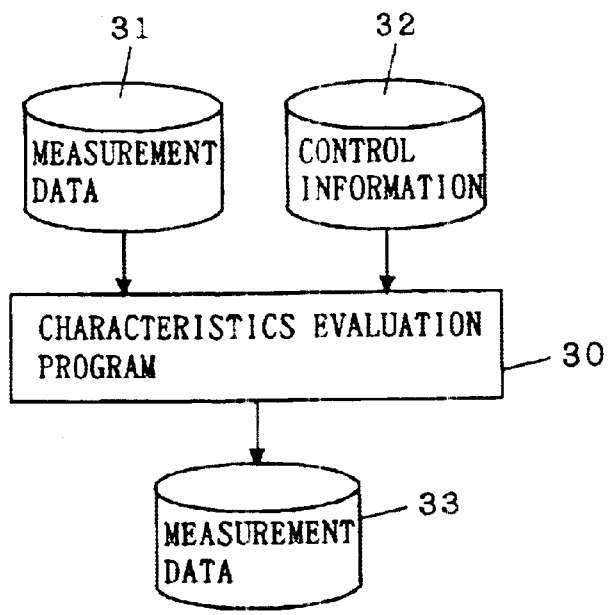
FIG. 9 is a conceptual diagram showing the concept in which a calculation section in FIG. 8 is implemented by a computer.

Referring to FIG. 9, the characteristic evaluation for insulated gate type transistors as described in the first preferred embodiment can be realized by making a computer to read an evaluation program 30 for evaluating insulated gate type transistors from a recording medium storing the program 30, in accordance with the procedure in FIG. 4 as described in the first preferred embodiment. By executing the evaluation program 30, a measurement data 33 containing data related to an effective channel width $W_{eff}$ can be extracted on the basis of a measurement data 31 provided from a measuring device 3 and a control information 32 from an input section 5 in FIG. 8, as described in the first preferred embodiment.

Figure 10:
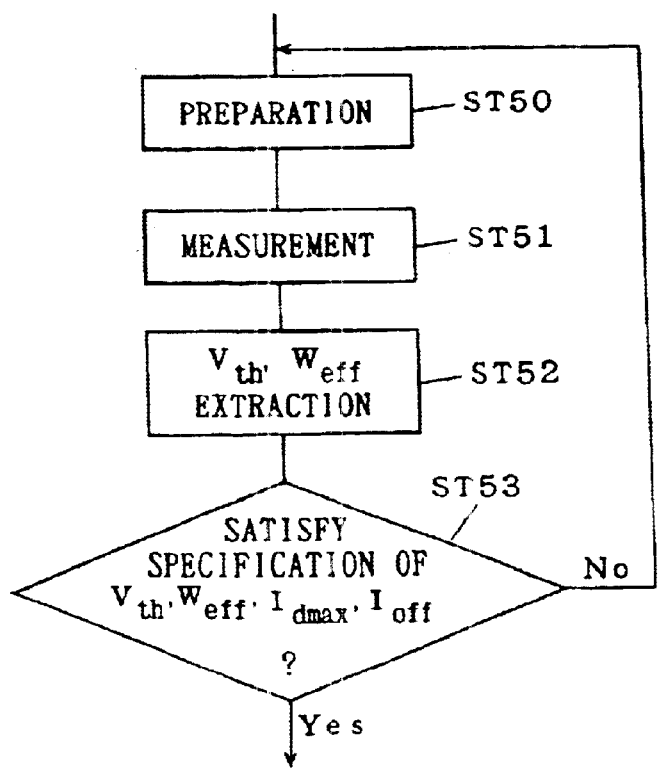
FIG. 10 is a flowchart showing the manufacturing steps for insulated gate type transistors which employs the characteristic evaluation method of the first preferred embodiment.

Description will be now given of a method of manufacturing an insulated gate type transistor according to the first preferred embodiment, by referring to FIG. 10. Firstly, a target narrow transistor and a reference wide transistor are prepared (step ST50). Then, the electrical characteristics of both transistors are measured (step ST51). In this step, the $I_{ds}$–$V_{gs}$ characteristic, off leak current $I_{off}$ and drain current $I_{dmax}$ of each transistor are measured. The off leak current $I_{off}$ is the current that flows between source and drain when, for example, $V_{ds}$=VDD and $V_{gs}$=$V_{bs}$=0 V, where VDD is power supply voltage.

By the characteristic evaluation method for insulated gate type transistors as described in the first preferred embodiment, the threshold voltage $V_{thNa}$ and effective channel width $W_{effNa}$ of the narrow transistor are extracted from $I_{ds}$–$V_{gs}$ characteristic or the like. Then, it is determined whether the threshold voltage $V_{thNa}$, effective channel width $W_{effNa}$, current $I_{dmax}$, and current $I_{off}$ of the narrow transistor satisfy a specification (step ST53). If not, it returns to step ST50 to perform another preparation of transistors by using a new mask.

Figure 11:
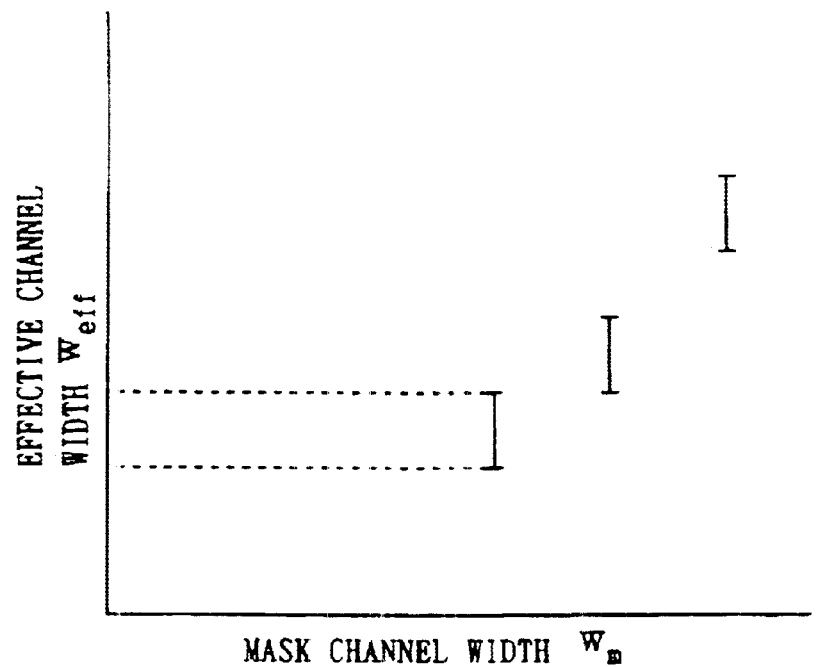
FIG. 11 is a graph showing the relationship between mask channel length and effective channel length in manufacturing an insulated gate type transistor.
Figure 12:
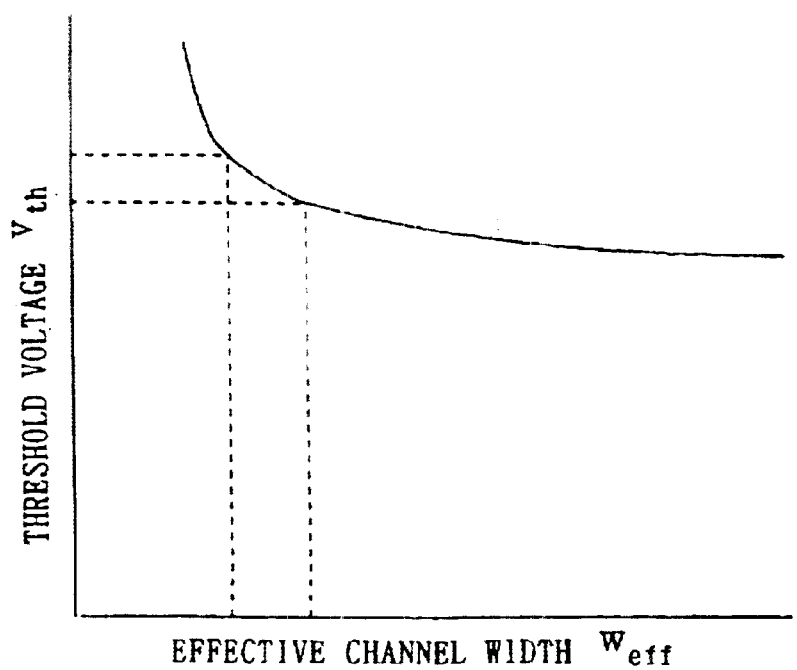
FIG. 12 is a graph showing the relationship between effective channel length and threshold voltage in manufacturing an insulated gate type transistor.

Thus, the characteristic evaluation method for insulated gate type transistors according to the first preferred embodiment produces the following effects. Firstly, since the threshold voltage is determined accurately from a known mask channel width and electrical characteristics, the time required for manufacturing is reduced, compared to the case where the section of an insulated gate type transistor is observed with an electron microscope or the like. Secondly, in response to a gate overdrive $V_{gt}$, the range of an effective channel width $W_{eff}$ in the desired mask channel width $W_m$ is found accurately (see FIG. 11). Thirdly, the variable range of the threshold voltage $V_{th}$ that corresponds to the variable range of an effective channel width $W_{eff}$ is found accurately at the same time (see FIG. 12), thus facilitating the quality control of the threshold voltage $V_{th}$ in manufacturing steps.

Second Preferred Embodiment

Figure 13:
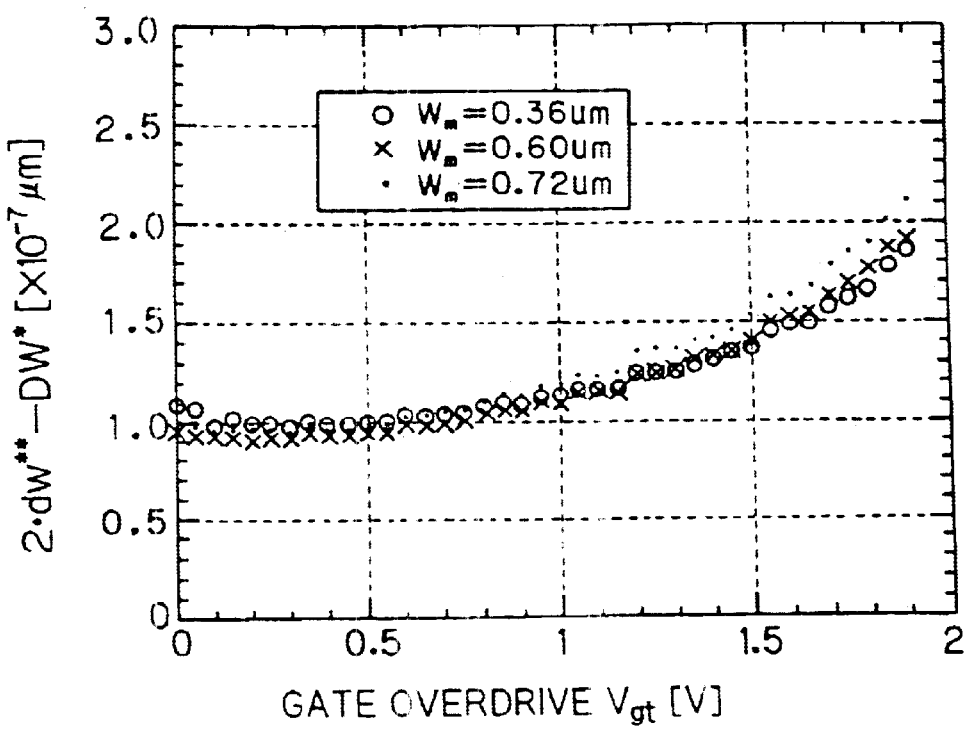
FIG. 13 is a graph for explaining the outline of a second preferred embodiment of the present invention.
Figure 14:
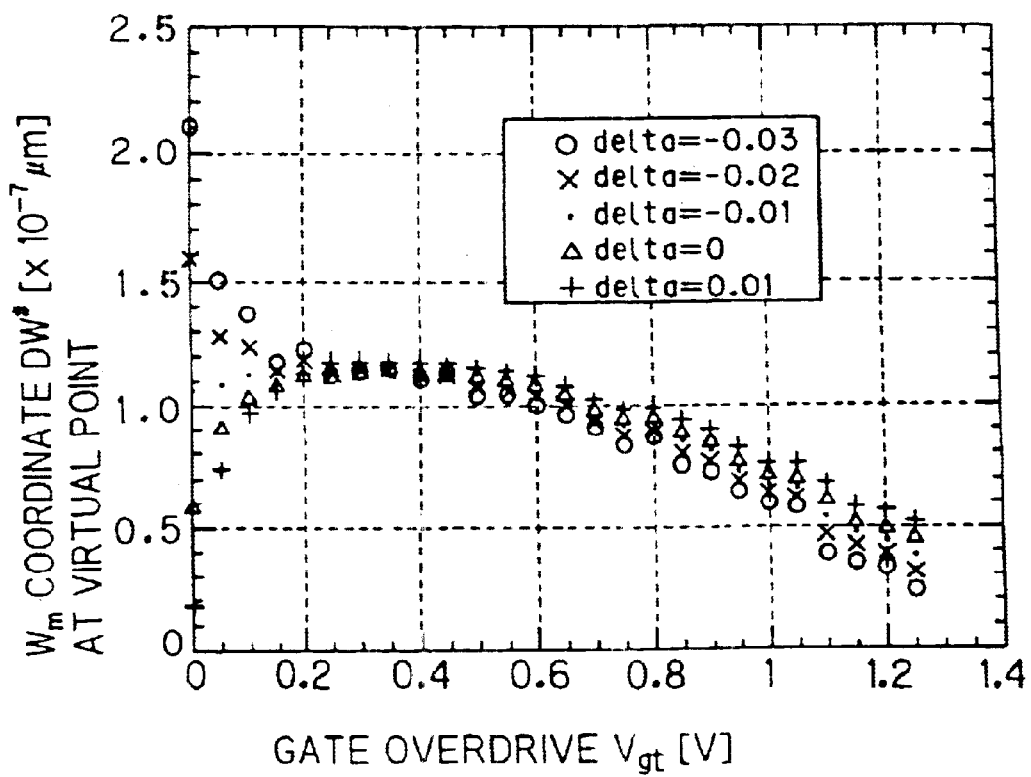
FIG. 14 is a graph showing the relationship between $W_m$ coordinate at a virtual point and threshold voltage error.
Figure 15:
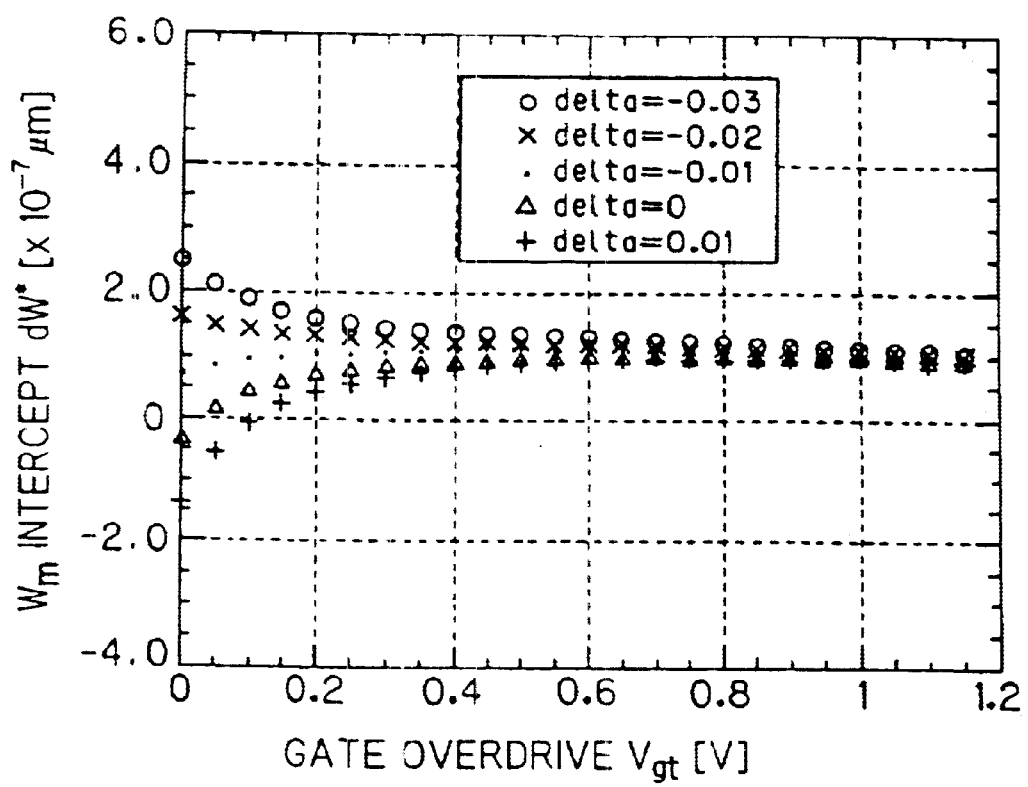
FIG. 15 is a graph for explaining the relationship between $W_m$ intercept and threshold voltage error.
Figure 16:
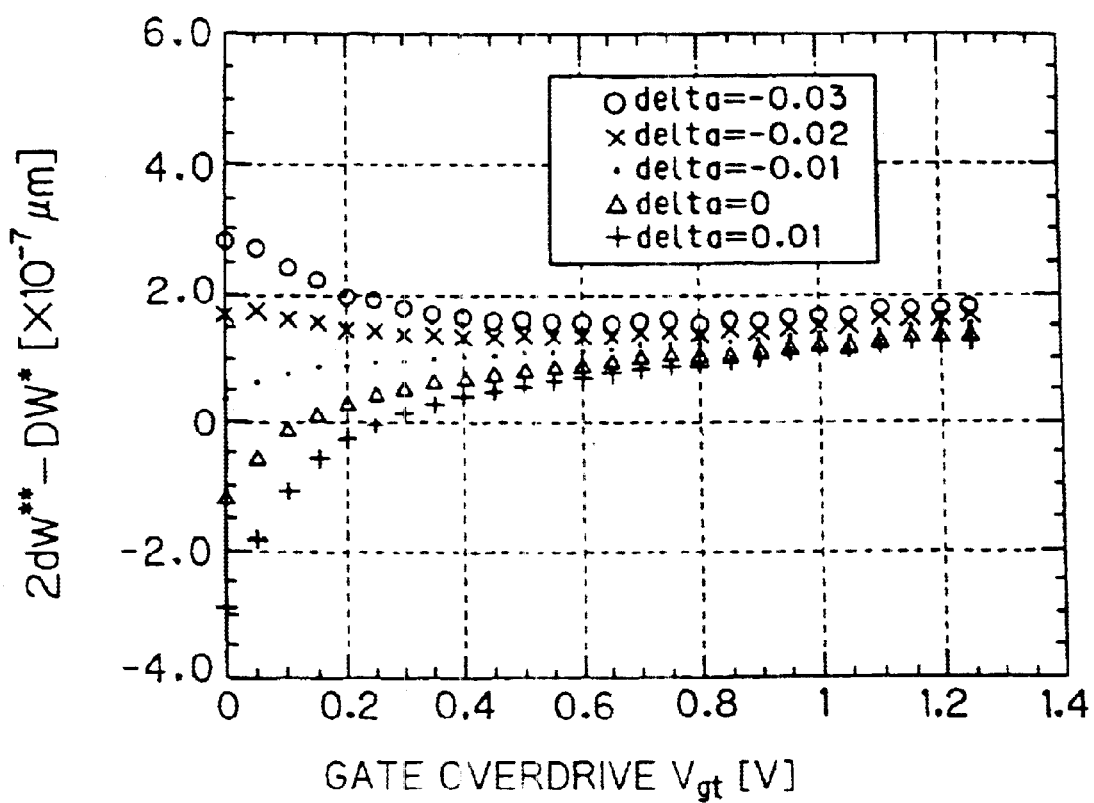
FIG. 16 is a graph for explaining the relationship between a value that is obtained by reducing the value of $W_m$ coordinate at a virtual point from twice the value of $W_m$ intercept, and threshold voltage error.

Description will be given of the outline of a characteristic evaluation method for insulated gate type transistors according to a second preferred embodiment, by referring to FIG. 13. FIG. 13 is a graph showing the relationship between the value of $(2 \cdot dW^{**}-DW^*)$ and gate overdrive $V_{gt}$ which are obtained by the characteristic evaluation method for insulated gate type transistors according to the second preferred embodiment. Specifically, this graph shows the change in the value of $(2 \cdot dW^{**}-DW^*)$ when a true threshold voltage is used for three narrow transistors which differ one another in mask channel width $W_{mNa}$. Note that the mask channel width $W_{mWi}$ of a wide transistor which serves as a reference in extracting the values $dW^{**}$ and $DW^*$ of $W_m$ coordinate of these narrow transistors, is set to the same value. A comparison of FIG. 13 with FIGS. 14 to 16 indicates that when used a true threshold voltage, the change in the value of $(2 \cdot dW^{**}-DW^*)$ against the gate overdrive $V_{gt}$ is approximately the same, irrespective of the mask channel widths $W_{mNa}$ of the narrow transistors. Therefore, the true threshold voltage of a narrow transistor can be extracted by finding out one which coincides with the characteristic curve of this graph when the value of a gate overdrive $V_{gt}$ is, for example, in the range of 0.3–1.2 V. In the second preferred embodiment, first and second insulated gate type transistors, first and second gate overdrives, and first and second estimated values, are also defined as in the first preferred embodiment.

Description will be now given of an example of a characteristic evaluation method for insulated gate type transistors according to the second preferred embodiment. In this method, the characteristic curve of FIG. 13 is extracted from characteristic curves that change variously depending on the estimated value of the threshold voltage $V_{thNa}$ of a narrow transistor, namely, a first estimated value, by making use of the fact that the standard deviations of the characteristic curves are small in the range of 0.2–0.6 V, for example. Since in this method the true threshold voltage of a narrow transistor is determined by utilizing the dependence of $(2 \cdot dW^{**} - DW^*)$ on a gate overdrive $V_{gt}$, it is determined in a procedure similar to that of the first preferred embodiment.

Figure 17:
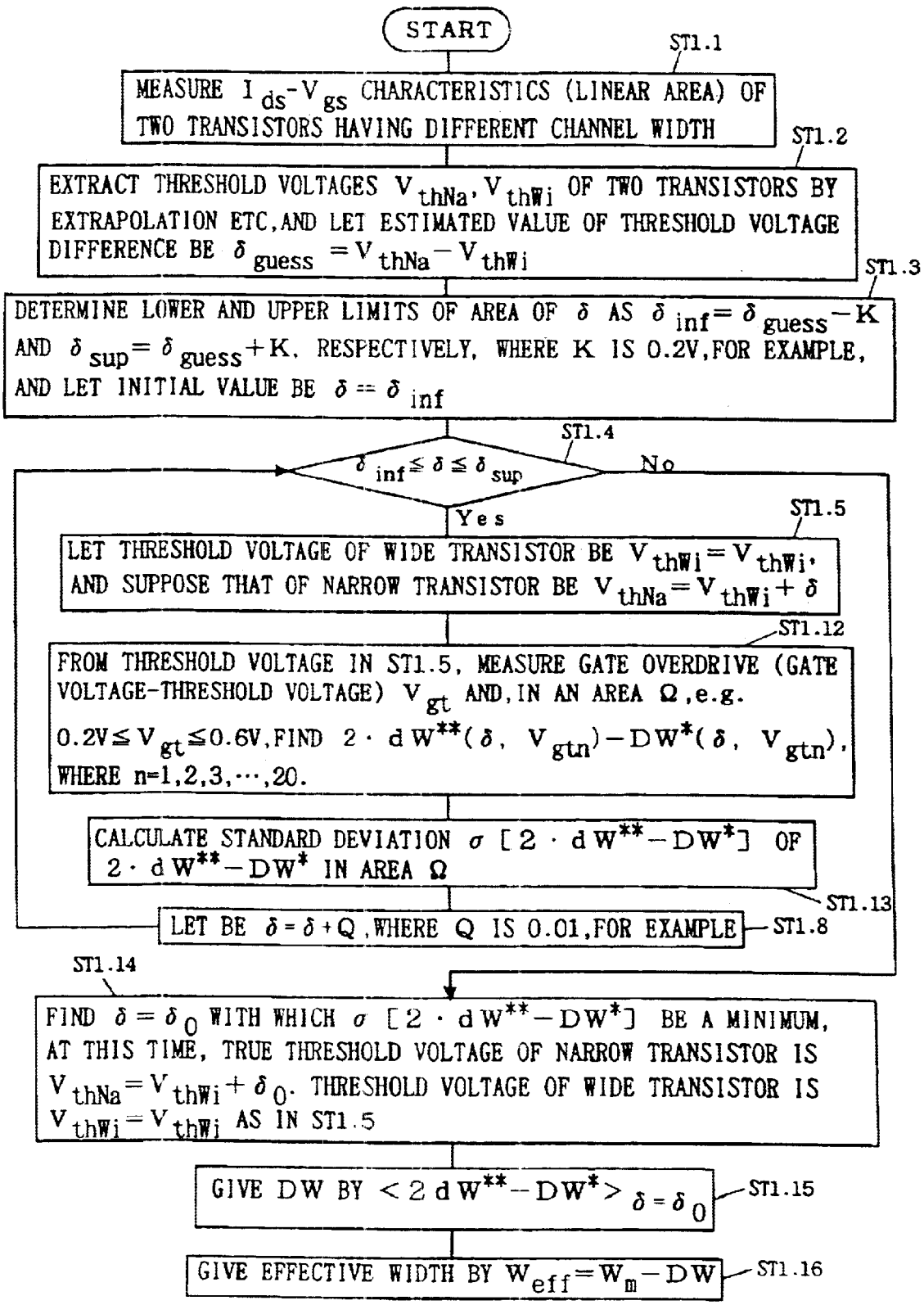
FIG. 17 is a flowchart giving an example of the procedure of a characteristic evaluation method for insulated gate type transistors according to the second preferred embodiment.

One example of the extraction procedure of an effective channel width $W_{eff}$ in the second preferred embodiment is given in FIG. 17. The extraction procedure of the second preferred embodiment is different from that of the first preferred embodiment in steps ST1.12, ST1.13 and ST1.14 to ST1.16 in FIG. 17, which correspond to steps ST1.6, ST1.7 and ST1.9 to ST1.11 in FIG. 4, respectively.

In step ST1.12, the value of $2 \cdot dW^{**} - DW^*$ against, for example, about 20 different gate overdrives $V_{gtn}$ are found by using the values of $W_m$ coordinate and $W_m$ intercept. In step ST1.13, there are calculated the average value $<2 \cdot dW^{**} - DW^*>$ and standard deviation $\sigma[2 \cdot dW^{**} - DW^*]$ of a value that is obtained by reducing the value $DW^*$ of $W_m$ coordinate at a virtual point from twice of the value $dW^{**}$ of $W_m$ intercept for a shift amount $\delta$.

When it is judged that in step ST1.13, the calculation of a shift amount $\delta$ in a predetermined range of $\delta_{inf}$ to $\delta_{sup}$ is terminated (step ST1.4), a true shift amount $\delta_0$ that gives a channel narrowing DW is estimated in step ST1.14. The true shift amount $\delta_0$ is a shift amount $\delta_0$ with which a standard deviation $\sigma[2 \cdot dW^{**} - DW^*]$ becomes a minimum. This means that the choice of a characteristic curve whose values are best converged on a fixed value. In step ST1.15, a channel narrowing DW is given by, for example, the average of the values $DW^*$ of $W_m$ coordinate at a virtual point for a shift amount $\delta_0$. In step ST1.16, an effective channel width $W_{eff}$ is determined from the difference between a mask channel width $W_m$ and the channel narrowing DW.

Figure 18:
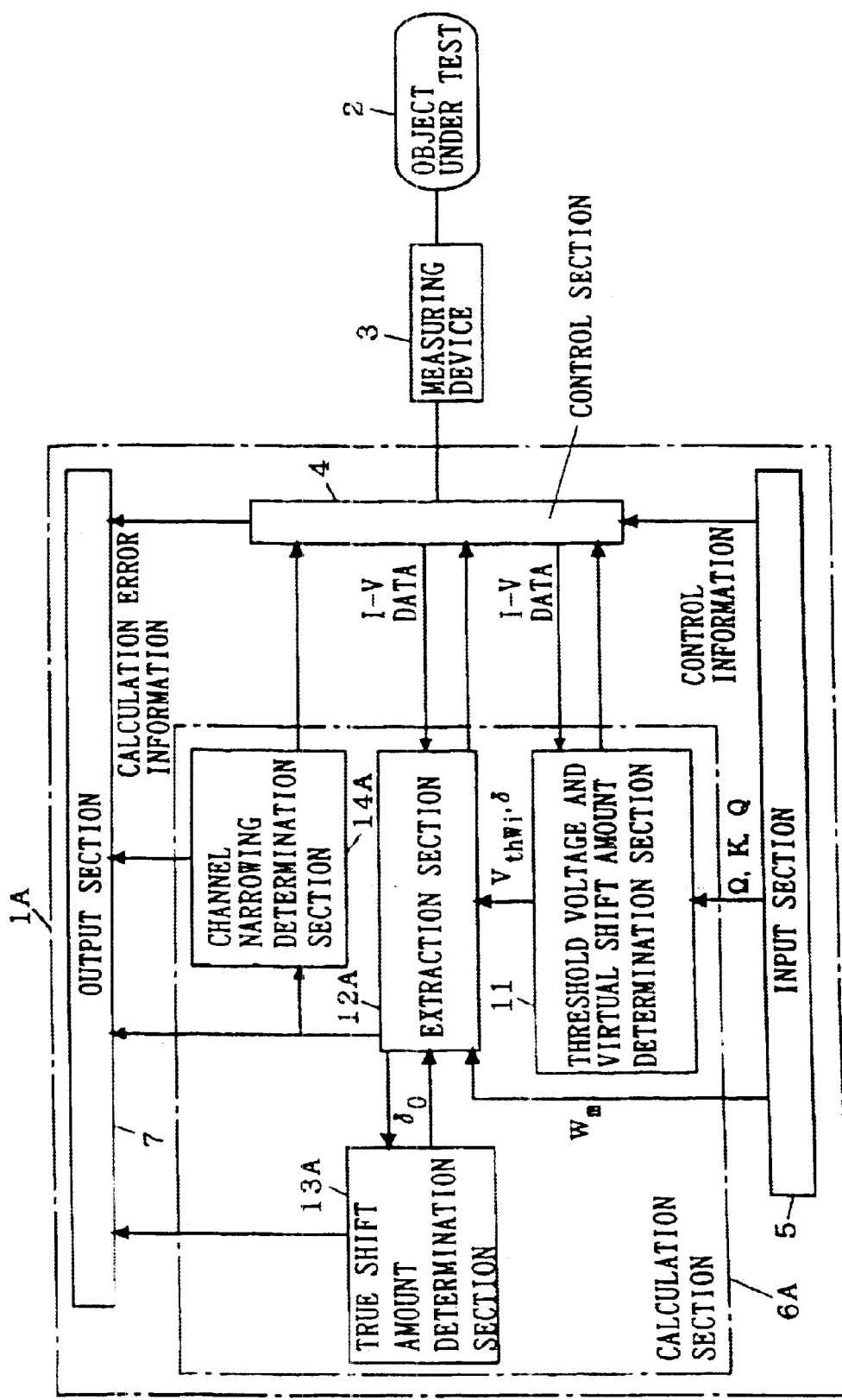
FIG. 18 is a block diagram giving an example of the construction of a characteristic evaluation apparatus for insulated gate type transistors according to the second preferred embodiment.

Referring to FIG. 18, a characteristic evaluation apparatus for insulated gate type transistors according to the second preferred embodiment will be described. A characteristic evaluation apparatus for insulated gate type transistors 1A shown in FIG. 18 is connected to a measuring device 3 for measuring an object under test 2, like the characteristic evaluation apparatus 1 of the first preferred embodiment as shown in FIG. 8. In the construction of the characteristic evaluation apparatus 1A, the same reference numerals have been retained for similar parts which have the same functions as in the apparatus 1 of FIG. 8. That is, the characteristic evaluation apparatus 1A has the same structure as the apparatus 1, except for an extraction section 12A, a true shift amount determination section 13A and a channel narrowing determination section 14A in a calculation section 6A. The extraction section 12A finds $(2 \cdot dW^{**} - DW^*)$ by changing a gate overdrive $V_{gt}$ in an area $\Omega$. In the true shift amount determination section 13A, a value with which the standard deviation $\sigma[2 \cdot dW^{**} - DW^*]$ becomes a minimum, is found from the value $DW^*$ of $W_m$ coordinate of an intersection and the value $dW^*$ of $W_m$ intercept in the area $\Omega$, to determine a true shift amount $\delta_0$. The extraction section 12A outputs the true shift amount $\delta_0$ and the value $DW^*$ of $W_m$ coordinate of the corresponding intersection or the value $dW^*$ of $W_m$ intercept, to the channel narrowing determination section 14A. The section 14A determines a channel narrowing DW from the average of $(2 \cdot dW^{**} - DW^*)$ when the gate overdrive $V_{gt}$ is in the vicinity of 0 V, e.g., in the range of $0.2 \leq V_{gt} \leq 0.6$, in an area $\Omega$ for a true shift amount $\delta_0$, alternatively, from the value $dW^{}$ of $W_m$ intercept. In the second preferred embodiment, a value with which the standard deviation $\sigma[2 \cdot dW^{} - DW^*]$ of the value $(2 \cdot dW^{**} - DW^*)$ becomes a minimum, or a value with which the standard deviation $\sigma[dW^{}]$ of the value $dW^{}$ of $W_m$ intercept becomes a minimum, is determined as a channel narrowing DW. Its determination method is, however, not limited to the above, and the threshold voltage $V_{thNa}$ of a narrow transistor may be determined by selecting a characteristic curve in which the value $dW^{}$ of $W_m$ intercept or the value of $(2 \cdot dW^{} - DW^*)$ is best converged on a fixed value when a gate overdrive $V_{gt}$ is within a predetermined range.

A method of manufacturing an insulted gate type transistor according to the second preferred embodiment can be implemented by employing, in step ST52 shown in FIG. 10, the evaluation method of the second preferred embodiment in place of that of the first preferred embodiment. This results in the same effects as in the case where the evaluation method of the first preferred embodiment is applied to a manufacturing method.

Referring again to FIG. 9, the characteristic evaluation for insulated gate type transistors as described in the second preferred embodiment is attainable by making a computer to read an evaluation program 30 for evaluating insulated gate type transistors from a recording medium storing the program 30, in accordance with the procedure in FIG. 17 as described in the second preferred embodiment.

In the channel narrowing DW extraction according to the first or second preferred embodiment, when the mask cannel width $W_{mNa}$ of a narrow transistor is significantly smaller than the mask cannel width $W_{mWi}$ of a wide transistor (i.e., $W_{mNa} << W_{mWi}$), the difference between the mask channel width $W_{mwi}$ and a gate finished width $W_{gWi}$ hardly affects on determination of the value $DW^*$ of $W_m$ coordinate at a virtual point, thereby determines the channel narrowing DW of the narrow transistor at high accuracy. For instance, to evaluate device or circuit performance on the level of not more than 1.0 μm in pattern width, it is required to extract the channel narrowing DW of each transistor. For such an extraction, there are used two transistors, i.e., a narrow transistor and a wide transistor serving as a reference. In this case, the difference between a gate finished width $W_g$ and a mask channel width $W_m$ depends on the transistor, causing an error. Thus, description will be now given of such an error. The value $dW^{**}$ of $W_m$ coordinate at a virtual point when a mask channel width $W_m$ is used is given by Equation 20.

$$dW^{**}(V_{gt}) = \left(W_{mNa} - \frac{G_{mNa}}{G_{mWi}} \cdot W_{mWi}\right) \cdot \left(1 - \frac{G_{mNa}}{G_{mWi}}\right)^{-1} \quad \text{(Eq. 20)}$$

If $W_g$ intercept in a plane formed by gate finished width and source-drain conductance (i.e., $W_g - G_m$ plane), is represented by $dW_g^{**}$, Equation 21 is obtained.

$$dW_g^{**}(V_{gt}) = \left(W_{gNa} - \frac{G_{mNa}}{G_{mWi}} \cdot W_{gWi}\right) \cdot \left(1 - \frac{G_{mNa}}{G_{mWi}}\right)^{-1} \quad \text{(Eq. 21)}$$

If the difference between a gate finished width $W_g$ and a mask channel width $W_m$ is represented by $\Delta W$, the difference between the gate finished width $W_{gWi}$ and mask channel width $W_{mWi}$ of a wide transistor, and the difference between the gate finished width $W_{gNa}$ and mask channel width $W_{mNa}$ of a narrow transistor are represented by $\Delta W_{Wi}$ and $\Delta W_{Na}$, respectively, thus the relationships of Equations 22 and 23 are established. From Equations 20 to 23, the difference between the coordinate value $dW^{**}$ of $W_m$ intercept and the coordinate value $DW_g^*$ of $W_g$ intercept is expressed by Equation 24, where $\Delta W$ is defined in Equation 25.

$$W_{gWi} = W_{mWi} + \Delta W_{Wi} \quad \text{(Eq. 22)}$$

$$W_{gNa} = W_{mNa} + \Delta W_{Na} \quad \text{(Eq. 23)}$$

$$dW^{} - dW_g^{} = -\Delta W_{Na} + \frac{G_{mNa}}{G_{mWi}} \cdot \left(1 - \frac{G_{mNa}}{G_{mWi}}\right)^{-1} \cdot \Delta W \quad \text{(Eq. 24)}$$

$$\approx -\Delta W_{Na} + \frac{G_{mNa}}{G_{mWi}} \cdot \Delta W$$

$$\approx -\Delta W_{Na} + \frac{W_{effNa}}{W_{effWi}} \cdot \Delta W$$

$$\Delta W = \Delta W_{Wi} - \Delta W_{Na} \quad \text{(Eq. 25)}$$

Equations 23 and 24 show that the effective channel width $W_{eff}$ of a narrow transistor is extracted when the relationship $W_{mNa} \ll W_{mWi}$ is established. In Equation 24, the second term of the last expression indicates an error. If a relative error is represented by r, Equation 26 is obtained. Then, let be $W_{gWi} \approx W_{mWi}$, Equation 26 is modified into Equation 27.

$$\frac{W_{effNa}}{W_{effWi}} \cdot |\Delta W| < r \cdot W_{effNa} \quad \text{(Eq. 26)}$$

$$W_{mWi} > \frac{|\Delta W|}{r} \quad \text{(Eq. 27)}$$

Equation 27 imposes limitations upon the size of a wide transistor. For instance, when $\Delta W = 0.1$ μm and $r = 0.02$, the mask channel width $W_{mWi}$ of a wide transistor is required to be greater than 5 μm, in order to accurately extract the effective channel width of a narrow transistor.

Also, in the case where a channel narrowing DW is determined from $(2 \cdot dW^{**} - DW^*)$, it is desirable to determine a mask channel width $W_{mWi}$ in a similar manner.

Third Preferred Embodiment

A characteristic evaluation method for insulated gate type transistors according to a third preferred embodiment will be described hereafter. In this method, a channel narrowing DW is extracted by using the drain currents of linear areas in two insulated gate type transistors that have the same mask channel length $L_m$ and a different mask channel width $W_m$.

Figure 19:
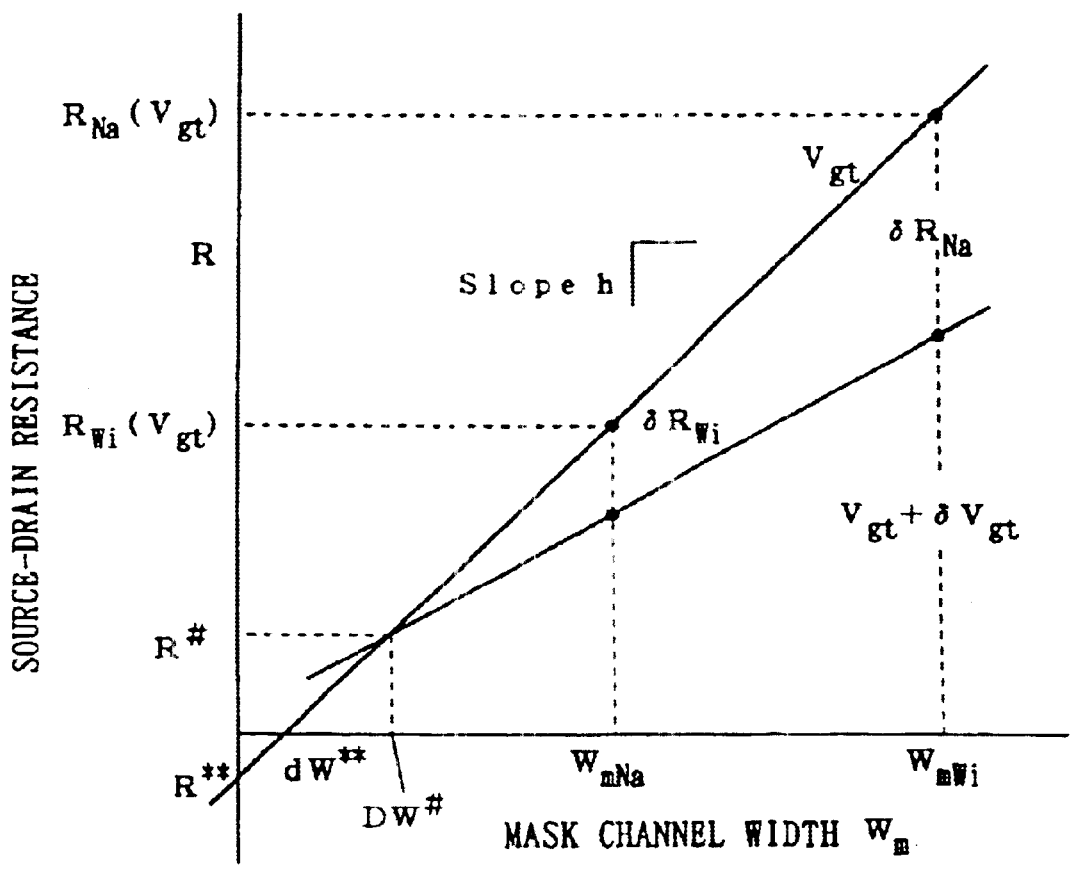
FIG. 19 is a graph for explaining a virtual point, R intercept and $W_m$ intercept in Rm method.

The above characteristic evaluation method in the third preferred embodiment will be roughed out. As in the first preferred embodiment, there are firstly prepared two MOS transistors, each having the same channel length $L_m$ and a different mask channel width $W_m$. Then, the threshold voltage $V_{thWi}$ of a wide transistor and the threshold voltage $V_{thNa}$ of a narrow transistor are extrapolated from $I_{ds}$-$V_{gs}$ characteristic or the like. The threshold voltage $V_{thNa}$ thus extracted is a first estimated value. Under the conditions that the gate overdrive $V_{gt}$ of the wide transistor, i.e., a first gate overdrive, is equal to the gate overdrive $V_{gt}$ of the narrow transistor, i.e., a second gate overdrive, a virtual point as described later is extracted in an X-Y plane whose X-axis is mask channel width $W_m$ and Y-axis is source-drain resistance R. This virtual point is not present as an actual measuring point, but is a virtual point on a straight line that passes through a first point whose X-coordinate is the mask channel width $W_{mWi}$ of the wide transistor and Y-coordinate is the source-drain resistance $R_{Na}$ of the narrow transistor, and a second point whose X-coordinate is the mask channel width $W_{mNa}$ of the narrow transistor and Y-coordinate is the source-drain resistance $R_{Wi}$ of the wide transistor. Such a virtual point has the characteristic feature that the change in source-drain resistance is approximately zero even when the first and second gate overdrives are finely changed. Therefore, as shown in FIG. 19, this virtual point is found as the intersection of two straight lines exhibiting the difference of $\delta V_{gt}$ between the first and second gate overdrives. The X-coordinate ($W_m$ coordinate) and Y-coordinate of the above intersection are represented by $DW^\#$ and $R^\#$, respectively. Note that the straight lines in the third preferred embodiment contain curves that can be approximated to a straight line. In the event that a virtual point is located slightly apart from the straight lines, a point in the vicinity of an intersection may be used.

The relationship of Equation 28 is established between the intersection coordinate ($R^\#$, $DW^\#$) and the slope h of a straight line in FIG. 19. In Equation 28, a prime indicates the first-order differentiation of $V_{gt}$.

$$R^{\#\prime} = h \cdot DW^{\#\prime} \quad \text{(Eq. 28)}$$

The values of $DW^\#$, ($\delta$, $V_{gtWi}$), $R^{\#\prime}$($\delta$, $V_{gtWi}$), and h($\delta$, $V_{gtWi}$) are found from the source-drain resistance of a narrow transistor $R_{Na}(V_{gtWi} + \delta - V_{thNa} + V_{thWi})$ and the source-drain resistance of a wide transistor $R_{Wi}(V_{gtWi})$. Hereat, $\delta$ is a shift amount to be changed in calculating the difference between two true threshold voltages $V_{thWi}$, $V_{thNa}$. When a shift amount $\delta$ is equal to the threshold voltage difference between the wide and narrow transistors ($V_{thNa} - V_{thWi}$), the relationship of Equation 28 is established. Accordingly, the function F that is defined in Equation 29 is zero, irrespective of the gate overdrive $V_{gt}$.

$$F(\delta, V_{gWi}) = R^{\#\prime}(\delta, V_{gtWi}) - h(\delta, V_{gtWi}) \cdot DW^{\#\prime}(\delta, V_{gtWi}) \quad \text{(Eq. 29)}$$

A shift amount $\delta$ is changed to determine the value of a true shift amount $\delta_0$ with which the standard deviation of function F is a minimum in a certain area of a gate overdrive $V_{gt}$. Using the true shift amount $\delta_0$, the value $dW^{}$ of X intercept is found by, for example, extrapolating straight lines as shown in FIG. 19. From the obtained $dW^{}$, a channel narrowing DW is determined. An effective channel width $W_{eff}$ is a value that is obtained by reducing a channel narrowing DW from a mask channel width $W_m$.

Figure 20:
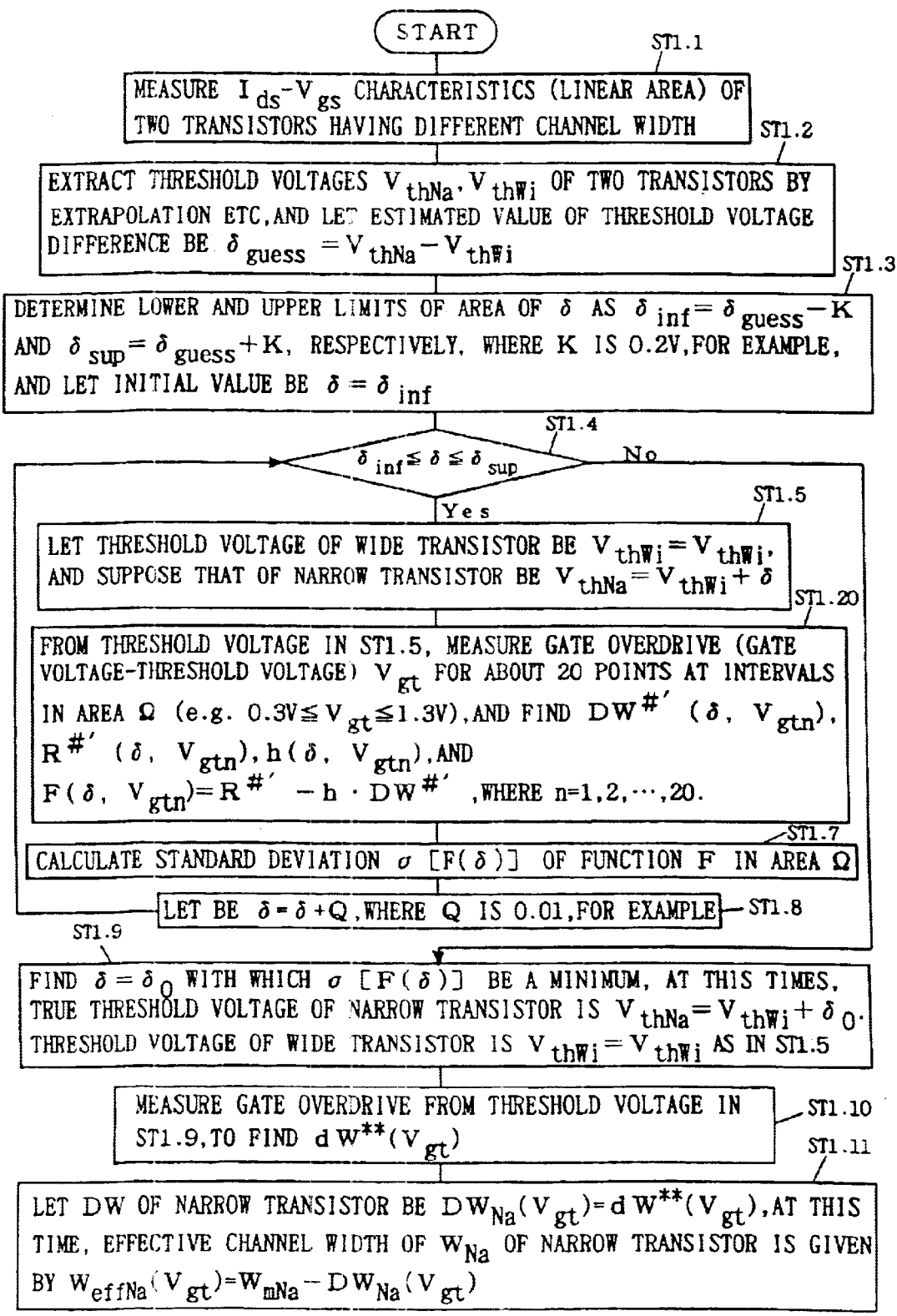
FIG. 20 is a flowchart giving an example of the procedure of a characteristic evaluation method for insulated gate type transistors according to a third preferred embodiment.

Referring to FIG. 20, extraction of the effective channel width $W_{eff}$ of an MOS transistor will be described in detail.

FIG. 20 shows the steps in a characteristic evaluation method for insulated gate type transistors according to the third preferred embodiment. The above steps are the same as those in FIG. 4 in the first preferred embodiment which are designated by the same reference numeral, except for step ST1.20. In step ST1.20, the function F shown in Equation 29 is calculated. In step ST1.9, by using a calculation result obtained in step ST1.20, a true shift amount $\delta_0$ is determined from a shift amount $\delta$ with which the standard deviation calculated in step ST1.7 is a minimum. Steps ST1.10 and ST1.11 in which from the above true shift amount, a channel narrowing DW and an effective channel width $W_{eff}$ are determined $\delta_0$, respectively, are the same as in the characteristic evaluation method of the first preferred embodiment as shown in FIG. 4.

Although a channel narrowing $DW_{Na}$ is determined from $dW^{**}$ in step ST1.11, a channel narrowing $DW(V_{gt})$ that is obtained when the gate overdrive $V_{gt}$ is in the vicinity of zero may be determined as the value $DW^\#$ of $W_m$ coordinate at an intersection.

Description will be now given of a concrete procedure to determine a channel narrowing DW and the like, from the standard deviation of the function F shown in Equation 29. In the characteristic evaluation method of the third preferred embodiment, to reduce the uncertainty of threshold voltage extrapolation and, in particular, the error due to the uncertainty of the threshold voltage extrapolation of a transistor having a narrow channel width, the relationship of Equation 30 which is, for example, established between the value $DW^*$ of $W_m$ coordinate at a virtual point and the value $dW^{**}$ of $W_m$ intercept, is noted to apply a variation method. Hereat, since the differentiation of an intersection coordinate $(R^\#, DW^\#)$ in Equation 29 may increase the error of calculated values, Equation 30 is used in place of Equation 29.

$$F(\delta, V_{gtWi}) = \qquad \text{(Eq. 30)}$$
$$dW^{}(\delta, V_{gtWi}) + \frac{h(\delta, V_{gtWi})}{h'(\delta, V_{gtWi})} \cdot dW^{'}(\delta, V_{gtWi}) - DW^\#(\delta, V_{gtWi})$$

Firstly, to a certain shift amount $\delta$, $DW^\#(V_{gtWi}, \delta)$ and $dW^{**}(V_{gtWi}, \delta)$ are given by Equations 31 and 32, respectively, where rri and rai are defined in Equations 33 and 34, respectively, and the slope h of a straight line is given by Equation 35.

$$DW^\# = \frac{W_{mNa} - rri \cdot W_{mWi}}{1 - rri} \qquad \text{(Eq. 31)}$$

$$dW^{**} = \frac{W_{mNa} - rai \cdot W_{mWi}}{1 - rai} \qquad \text{(Eq. 32)}$$

$$rri(V_{gtWi}, \delta) \equiv \frac{R'_{Wi}(V_{gtWi})}{R'_{Na}(V_{gtWi} + \delta - V_{thNa} + V_{thWi})} \qquad \text{(Eq. 33)}$$

$$rai(V_{gtWi}, \delta) \equiv \frac{R_{Wi}(V_{gtWi})}{R_{Na}(V_{gtWi} + \delta - V_{thNa} + V_{thWi})} \qquad \text{(Eq. 34)}$$

$$h(V_{gtWi}, \delta) = \frac{R_{Na}(V_{gtWi} + \delta - V_{thNa} + V_{thWi}) - R_{Wi}(V_{gtWi})}{W_{mWi} - W_{mNa}} \qquad \text{(Eq. 35)}$$

A shift amount $\delta$ is changed to find the value $DW^\#$ of $W_m$ coordinate, the value $dW^{}$ of $W_m$ intercept and its rate of change $dW^{'}$, as well as the resistance R per unit width and its rate of change R'.

Figure 21:
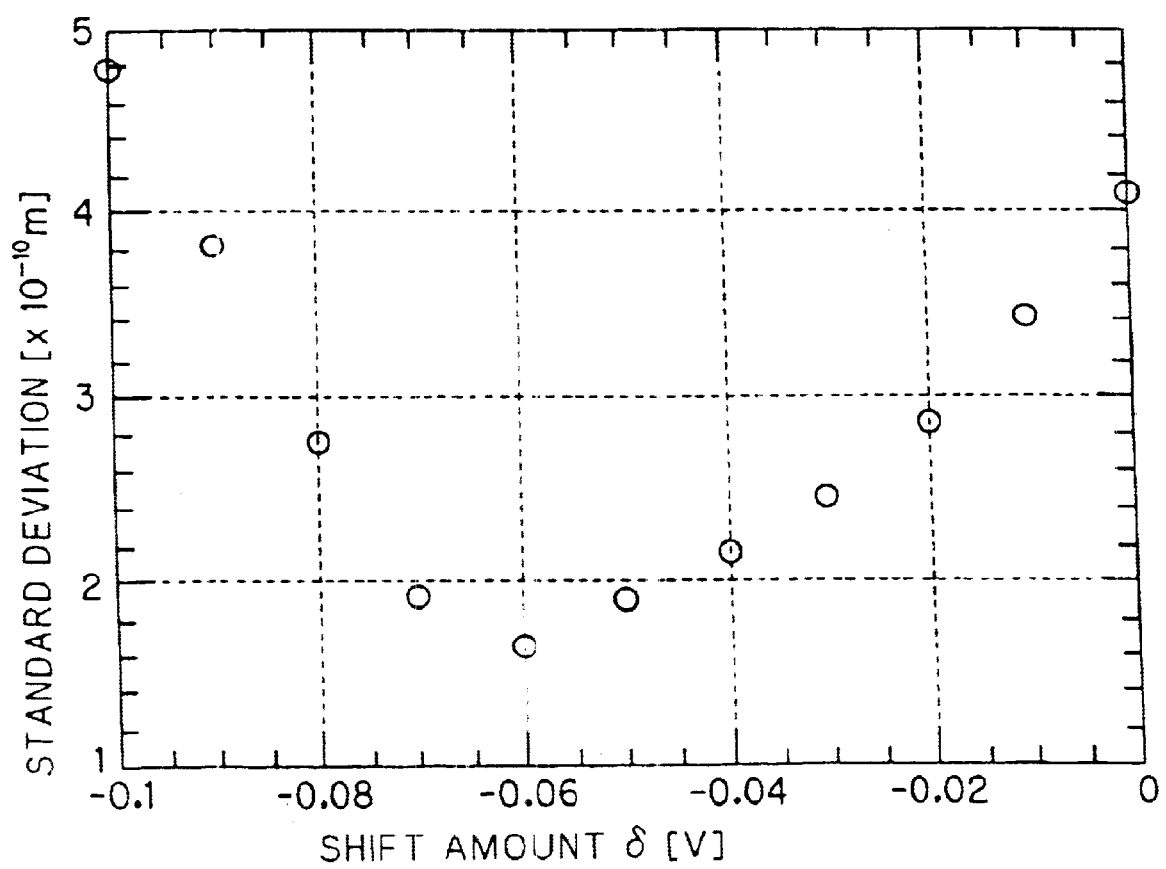
FIG. 21 is a graph for explaining a true shift amount determination according to the third preferred embodiment.

When a shift amount $\delta$ is equal to the threshold voltage difference $\delta_0$ between narrow and wide transistors, the function F defined in Equation 30 is zero, irrespective of the gate overdrive $V_{gtWi}$. Thus, let the value of a shift amount $\delta$ with which the standard deviation of the function F becomes a minimum in an area of a gate overdrive $V_{gtWi}$ be a true shift amount $\delta_0$ (see FIG. 21).

Then, let the value of $dW^{**}$ $(V_{gt}, \delta_0)$ of $W_m$ intercept which is obtained by using a true shift amount $\delta_0$, be a channel narrowing $DW(V_{gt})$.

Although in the third preferred embodiment a true shift amount $\delta_0$ is determined from the condition under which the standard deviation of the function F is a minimum, it may be determined from the condition under which the sum of values that are obtained by squaring each of the functions F to be found for discrete gate overdrives $V_{gt}$, becomes a minimum. When calculating gate overdrive $V_{gt}$ for about 20 points, the sum Z can be expressed by Equation 36.

$$Z = \sum_{n=1}^{20} F^2(V_{gtn}) \qquad \text{(Eq. 36)}$$

Instead of Equation 30, any one of Equations 37 to 39 may be used to find function F.

$$F(\delta, V_{gtWi}) = \frac{h^2(\delta, V_{gtWi})}{h'(\delta, V_{gtWi})} \cdot dW^{**'}(\delta, V_{gtWi}) - R^\#(\delta, V_{gtWi}) \qquad \text{(Eq. 37)}$$

$$F(\delta, V_{gtWi}) = R^{}(\delta, V_{gtWi}) - \frac{h(\delta, V_{gtWi})}{h'(\delta, V_{gtWi})} \cdot R^{'}(\delta, V_{gtWi}) - R^\#(\delta, V_{gtWi}) \qquad \text{(Eq. 38)}$$

$$F(\delta, V_{gtWi}) = \frac{R^{**'}(\delta, V_{gtWi})}{h'(\delta, V_{gtWi})} + DW^\#(\delta, V_{gtWi}) \qquad \text{(Eq. 39)}$$

In Equations 38 and 39, $R^{}$ is the value of a source-drain resistance R when the value of a mask channel width $W_m$ is set to be zero in $R-W_m$ characteristic. Using mask channel width $W_m$ to enter an X-axis and source-drain resistance R to enter a Y-axis, a $R-W_m$ characteristic curve (straight line) is extrapolated to find the value $R^{}$ of a Y intercept and the value $dW^{}$ of an X intercept which are obtained as X=0 and Y=0, respectively. The use of the value $R^{}$ or $dW^{}$ facilitates calculation. Although the accuracy remains unchanged with any one of Equations 30, and 37 to 39, it is necessary to calculate $R^{}$ when using Equation 38 or 39. Thus, Equation 30 or 37 is preferred.

Figure 22:
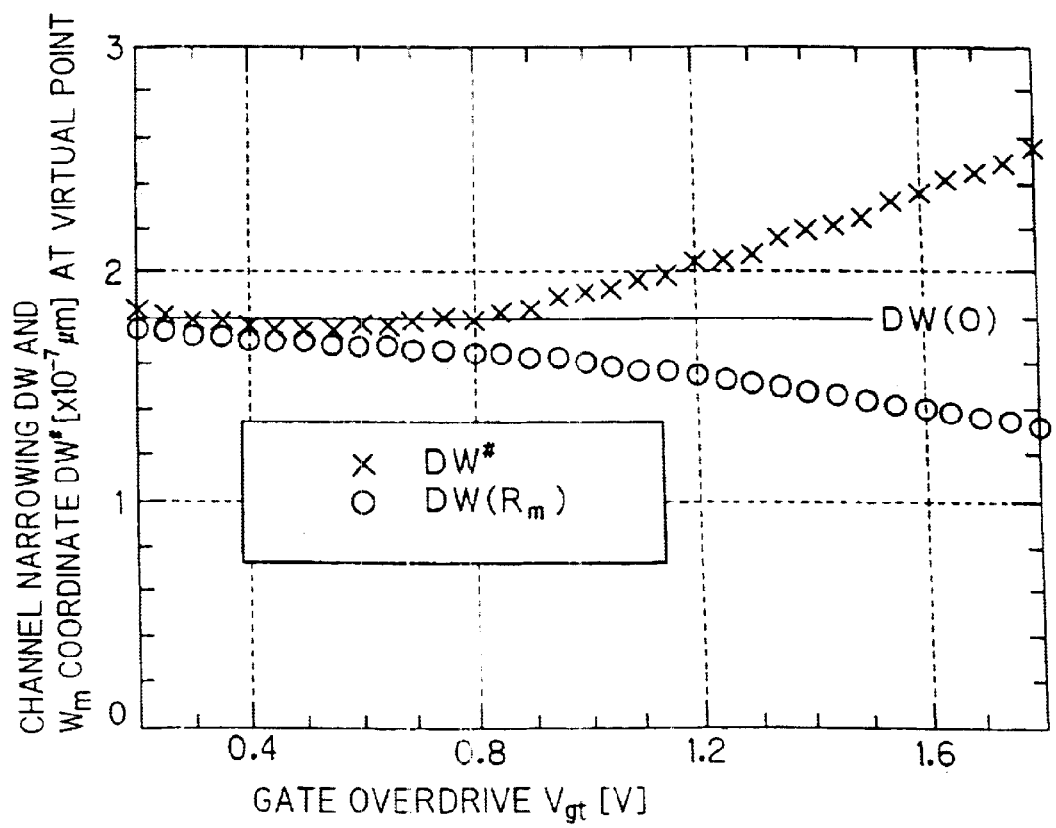
FIG. 22 is a graph for explaining the relationship between channel narrowing and $W_m$ coordinate at a virtual point.

Although in the third preferred embodiment the value $dW^{**}$ of $W_m$ intercept obtained when a true shift amount $\delta_0$ is used is employed as the value of a channel narrowing DW, the value of a channel narrowing DW obtained when a gate overdrive $V_{gt}$ is in the vicinity of zero may be given by the average of the values $DW^\#$ in the neighborhood where the value $DW^\#$ of $W_m$ coordinate of an intersection has a minimum value (see FIG. 22). Since $DW^\#$ has a stationary point when the gate overdrive $V_{gt}$ has a value in the vicinity of zero, it is possible to determine the value of a channel narrowing DW at higher accuracy than the case of using the value $dW^*$ of $W_m$ intercept.

Figure 23:
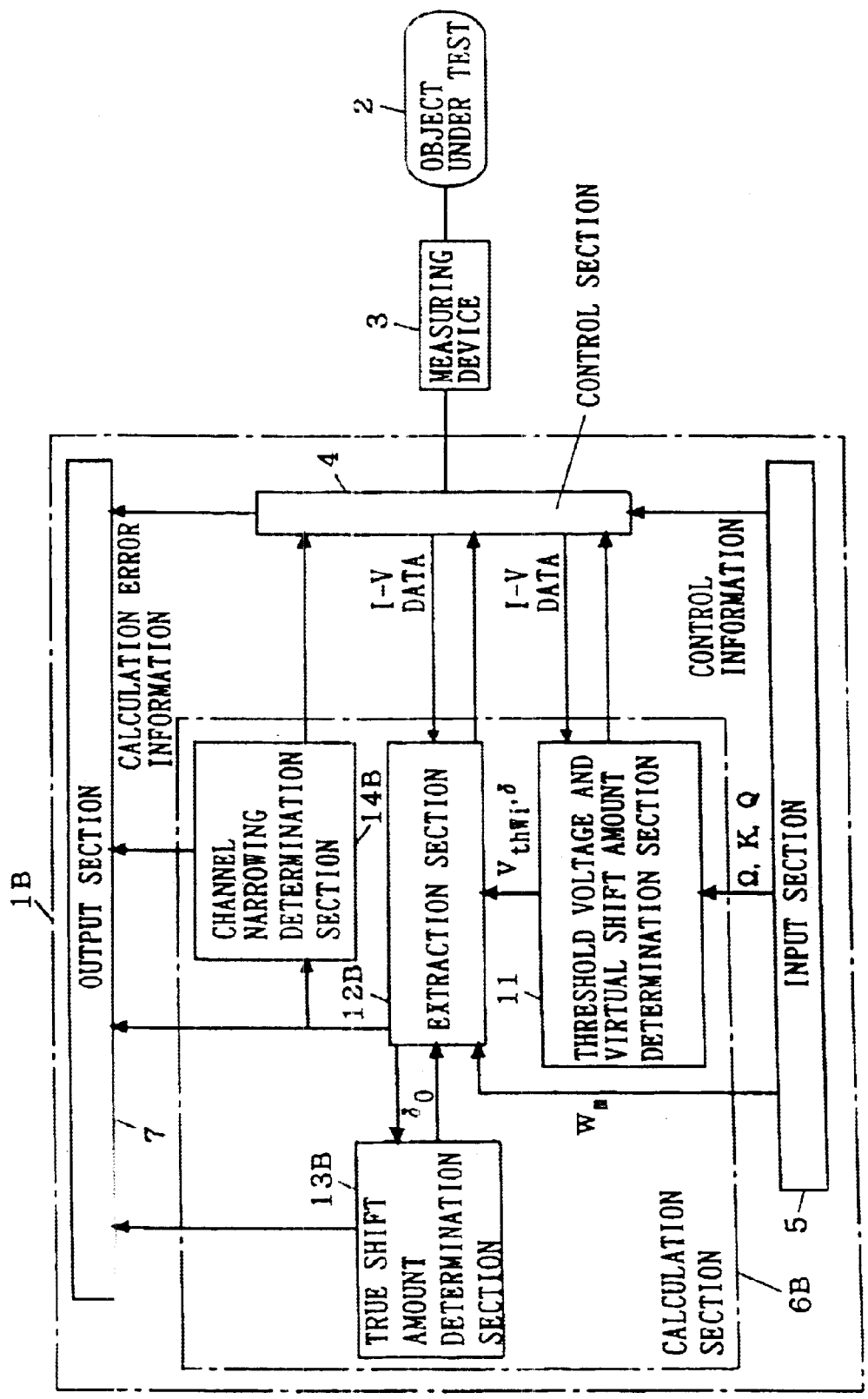
FIG. 23 is a block diagram giving an example of the construction of a characteristic evaluation apparatus for insulated gate type transistors according to the third preferred embodiment.

Referring to FIG. 23, a characteristic evaluation apparatus for insulated gate type transistors according to the third preferred embodiment can be constructed by partially modifying the calculation section 6 of the characteristic evaluation apparatus 1 of the first preferred embodiment in FIG. 8. Specifically, the parts to be modified are an extraction section 12B that extracts an intersection coordinate $(DW^\#, R^\#)$ as the coordinate of a virtual point, the value $dW^{}$ of $W_m$ intercept, the value $R^{}$ of R intercept, and the slope h of a straight line in the intersection coordinate; a true shift amount determination section 13B that determines a true shift amount $\delta_0$ from the values extracted in the extraction section 12B; and a channel narrowing determination section 14B that determines a channel narrowing by using a value giving a true shift amount $\delta_0$ which is selected from among the values extracted in the extraction section 12B. Other components of the calculation section 6B in FIG. 23 are the same as those in the first preferred embodiment. The extraction section 12B further extracts the rate of change $dDW^\#/dV_{gt}$, $dR^\#/dV_{gt}$ of an intersection coordinate $(DW^\#, R^\#)$ and the slope h of a characteristic curve in an area Ω with respect to each shift amount $\delta$, by using the value of a mask channel width $W_m$ provided from an input section 5, the measurement data of source-drain current $I_{ds}$ and gate-source voltage $V_{gt}$ that are provided from a control section 4. The true shift amount determination section 13B determines a virtual shift amount $\delta_0$ with which the standard deviation of the function F shown in Equation 29 becomes a minimum for the area $\Omega$, by using the rate of change $dDW^\#/dV_{gt}$ of the $W_m$ coordinate of an intersection, the rate of change $dR^\#/dV_{gt}$ of R coordinate of the intersection, and the slope h of the characteristic curve which have been extracted in the extraction 12B. Upon determination of a true shift amount $\delta_0$, the extraction section 12B outputs the true shift amount $\delta_0$ or the value $DW^\#$ of $W_m$ coordinate of the corresponding intersection and value $dW^{}$ of $W_m$ intercept, to a channel narrowing determination section 14B. The section 14B determines a channel narrowing DW from the value $dW^{}$ of $W_m$ intercept or the value $DW^\#$ of $W_m$ coordinate in a virtual point, and performs the calculation shown in Equation 7, to determine an effective channel width $W_{eff}$.

Referring again to FIG. 9, the characteristic evaluation for insulated gate type transistors as described in the third preferred embodiment is attainable by making a computer to read an evaluation program 30 for evaluating insulated gate type transistors from a recording medium storing the program 30, in accordance with the procedure in FIG. 20 as described in the third preferred embodiment.

A method of manufacturing an insluted gate type transistor according to the third preferred embodiment can be implemented by employing, in step ST52 shown in FIG. 10, the evaluation method of the third preferred embodiment in place of that of the first preferred embodiment. This results in the same effects as in the case where the evaluation method of the first preferred embodiment is applied to a manufacturing method.

Fourth Preferred Embodiment

A characteristic evaluation method for insulated gate type transistors according to a fourth preferred embodiment will be outlined by referring to FIG. 24. FIG. 24 is a graph showing the relationship between $DW^\#$ and gate overdrive $V_{gt}$ that are found by the characteristic evaluation method for insulated gate type transistors according to the fourth preferred embodiment. This graph shows the change in the value $DW^\#$ of $W_m$ coordinate of an intersection when a true threshold voltage is used for three narrow transistors having a different mask channel width $W_{mNa}$. Note that the mask channel width $W_{mWi}$ of a wide transistor that serves as a reference in extracting the value $DW^\#$ of $W_m$ coordinate for these transistors, is set to the same value.

Figure 25:
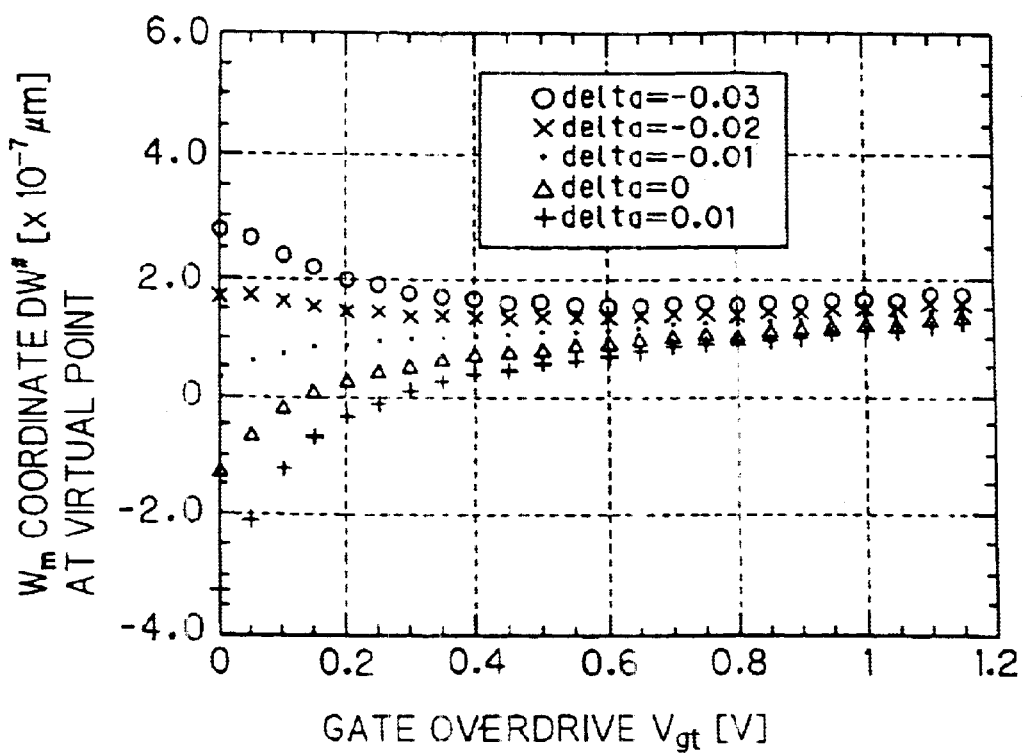
FIG. 25 is a graph showing the relationship between $W_m$ coordinate at a virtual point and threshold voltage error.

As shown by comparison of FIG. 24 with FIG. 25, if the value of a shift amount $\delta$ derives from a shift amount $\delta_0$, the shape of a $V_{gt}$–$DW^\#$ characteristic curve changes, whereas even if the value of a mask channel width $W_{mNa}$ changes somewhat, the shape of a $V_{gt}$–$DW^\#$ characteristic curve remains unchanged. Hence, as to other transistor having a different mask channel width $W_m$, it is also possible to extract the true threshold voltage of a narrow transistor by finding out one characteristic curve which coincides with that in this graph when the gate overdrive $V_{gt}$ ranges from 0.3 to 1.2 V, for example. In the fourth preferred embodiment, first and second gate overdrives and first to fourth estimated values are defined as in the third preferred embodiment.

One example of the characteristic evaluation method for insulated gate type transistors according to the fourth preferred embodiment will be described by referring to FIG. 26. In the method shown in FIG. 26, from characteristic curves that change variously depending on the estimated value of a threshold voltage $V_{thNa}$, i.e., a first estimated value, the characteristic curve in FIG. 24 is extracted based on the fact that the standard deviation of the curve is small in the range of 0.2 to 0.6 V, for example. Since in the evaluation method of the fourth preferred embodiment, the true threshold voltage $\delta_0$ of a narrow transistor is determined by utilizing the dependence of the value $DW^\#$ of $W_m$ coordinate on a gate overdrive $V_{gt}$, the true threshold voltage $\delta_0$ is determined in a manner similar to that in the third preferred embodiment.

Figure 26:
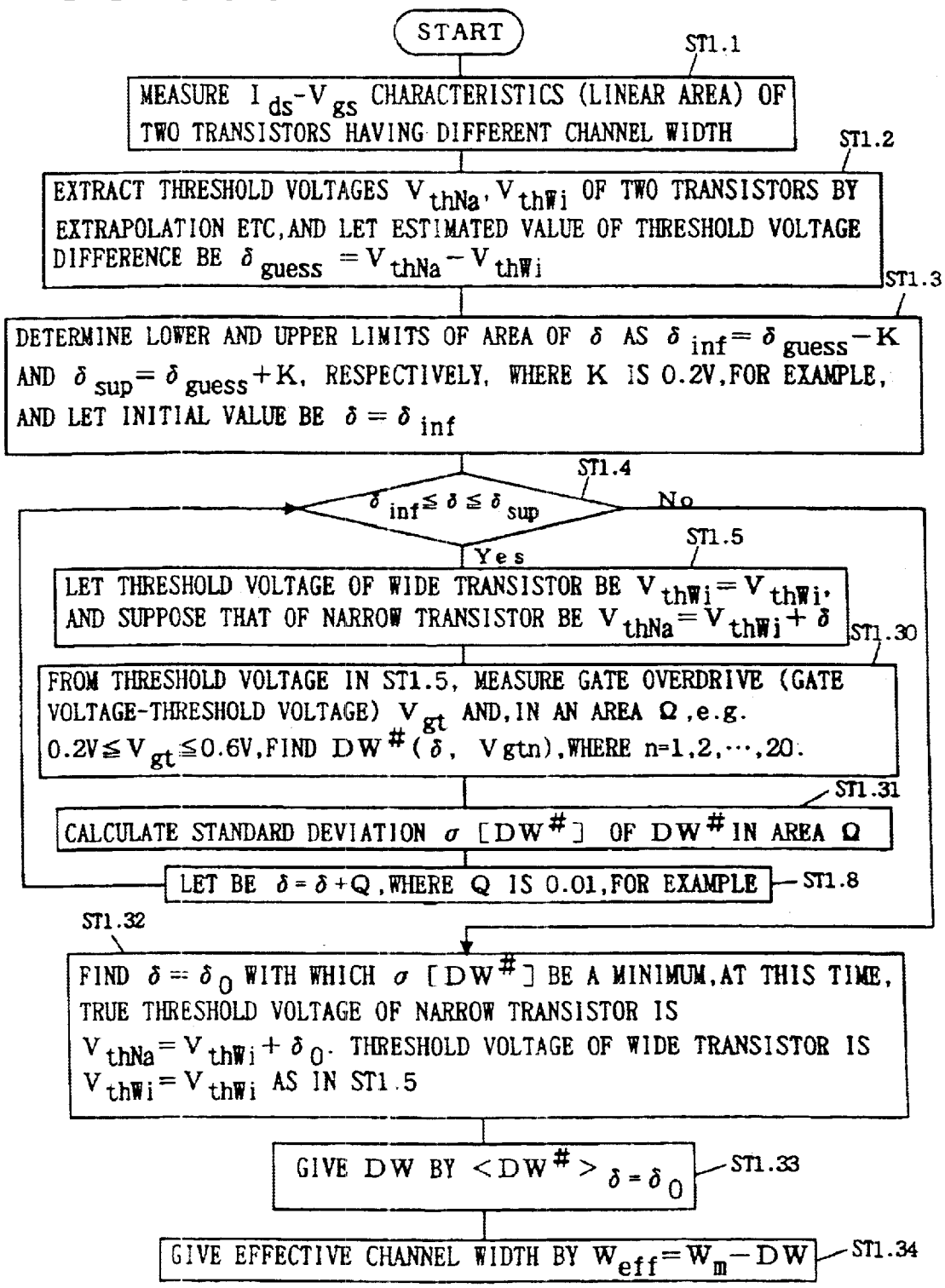
FIG. 26 is a flowchart giving an example of the procedure of a characteristic evaluation method for insulated gate type transistors according to the fourth preferred embodiment.

The procedure of extracting an effective channel width $W_{eff}$ in the characteristic evaluation method of the fourth preferred embodiment is the same as that of the third preferred embodiment, except for steps ST1.30 to ST1.34 in FIG. 26, which correspond to steps ST1.20, ST1.7 and ST1.9 to ST1.11 in FIG. 20, respectively.

In the loop composed of steps ST1.4 to ST1.8, at step ST1.30 the value $DW^\#$ of $W_m$ coordinate at a virtual point is found. That is, the values $DW^\#$ of about twenty different gate overdrives $V_{gtn}$ for each shift amount $\delta$ are found. At step ST1.31, the average of the twenty $DW^\#$ values of $DW^\#(\delta, V_{gt1})$ to $DW^\#(\delta, V_{gtn})$, and the standard deviation $\sigma[DW^\#]$ are calculated.

After repeat calculation for each shift amount $\delta$ (steps ST1.14 to ST1.8) is terminated, at step ST1.32, a shit amount $\delta_0$ for giving a channel narrowing DW is estimated, with which the standard deviation $\sigma$ becomes a minimum. At step ST1.33, the channel narrowing DW is given by the average of the values $DW^\#$ of $W_m$ coordinates at a virtual point when a shit amount is $\delta_0$. At step ST1.34, an effective channel width $W_{eff}$ is determined by the difference between a mask channel width and the channel narrowing DW.

Figure 27:
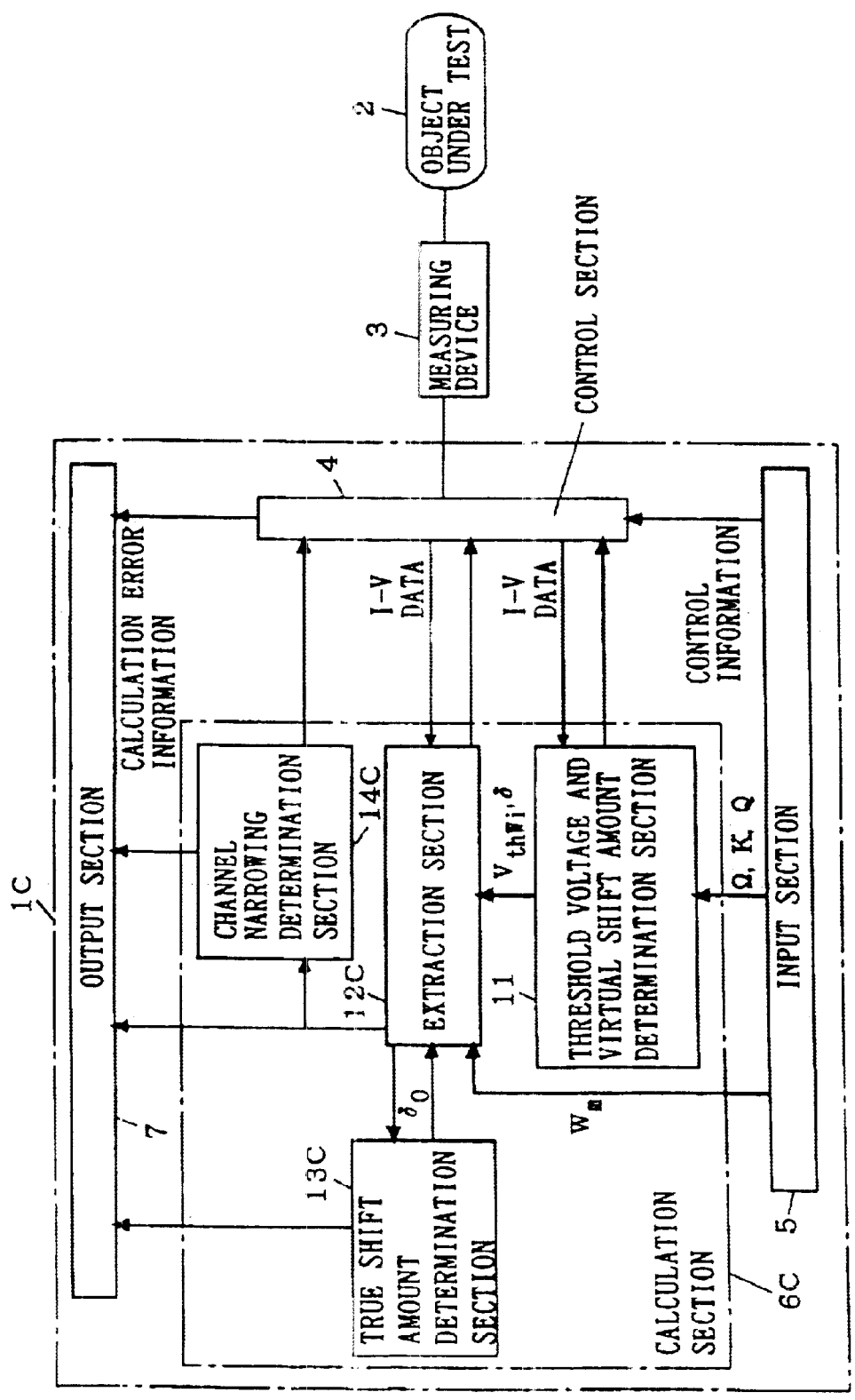
FIG. 27 is a block diagram giving an example of the construction of a characteristic evaluation apparatus for insulated gate type transistors according to the fourth preferred embodiment.

Referring to FIG. 27, description will be now given of a characteristic evaluation apparatus for insulated gate type transistors according to the fourth preferred embodiment. A characteristic evaluation apparatus for insulated gate type transistors 1C shown in FIG. 27 is connected to a measuring device 3 for measuring an object under test 2, like the characteristic evaluation apparatus 1B of the third preferred embodiment as shown in FIG. 23. In the construction of the characteristic evaluation apparatus 1C, the same reference numerals have been retained for similar parts which have the same functions as in the apparatus 1B of FIG. 23. That is, the characteristic evaluation apparatus 1C has the same structure as the apparatus 1B, except for an extraction section 12C, a true shift amount determination section 13C and a channel narrowing determination section 14A in a calculation section 6C.

The extraction section 12C of the characteristic evaluation apparatus 1C finds an intersection coordinate $(DW^\#, R^\#)$ by changing a gate overdrive $V_{gt}$ in an area $\Omega$. The true shit amount determination section 13C finds a standard deviation $\sigma[DW^\#]$ from the value of the intersection coordinate $(DW^\#, R^\#)$ in the area $\Omega$, to determine a true shift amount $\delta_0$. The extraction section 12C outputs the true shift amount $\delta_0$ and the value $DW^\#$ of $W_m$ coordinate at the corresponding intersection or the value $dW^{}$ of $W_m$ intercept, to the channel narrowing determination section 14C. The channel narrowing section 14C determines a channel narrowing DW from the average of the values $DW^\#$ of $W_m$ coordinates at virtual points within the area $\Omega$ for the true shift amount $\delta_0$, e.g., in the range of $0.2 \leq V_{gt} \leq 0.6$. Alternatively, the section 14C determines the value $dW^{}$ of $W_m$ intercept related to the true shift amount $\delta_0$, as a channel narrowing DW.

Referring again to FIG. 9, the characteristic evaluation for insulated gate type transistors as described in the fourth preferred embodiment is attainable by making a computer to read an evaluation program 30 for evaluating insulated gate type transistors from a recording medium storing the program 30, in accordance with the procedure in FIG. 20 as described in the fourth preferred embodiment.

A method of manufacturing an insulted gate type transistor according to the fourth preferred embodiment can be implemented by employing, in step ST52 shown in FIG. 10, the evaluation method of the fourth preferred embodiment in place of that of the first preferred embodiment. This results in the same effects as in the case where the evaluation method of the first preferred embodiment is applied to a manufacturing method.

Although in the fourth preferred embodiment, a channel narrowing DW is determined so as to minimize the standard deviation σ[DW$^{\#}$] of the value DW$^{\#}$ of W$_m$ coordinate at an intersection or the standard deviation σ[dW] of the value dW of W$_m$ intercept, its determination method is not limited to the above. For instance, the threshold voltage V$_{thNa}$ of a narrow transistor may be determined by selecting a characteristic curve in which the value DW** of W$_m$ coordinate at an intersection is best converged on a fixed value when the gate overdrive V$_{gt}$ is within a predetermined range.

When the mask channel width W$_{mNa}$ of a narrow transistor is sufficiently smaller than the mask channel width W$_{mWi}$ of a wide transistor (W$_{mNa}$<<W$_{mWi}$), Equation 31 is approximated as shown in Equation 40. Accordingly, a channel narrowing DW may be determined so that the standard deviation of the value of Equation 40 is a minimum.

$$DW^{\#} \approx W_{mNa} - rri \cdot W_{mWi} \quad \text{(Eq. 40)}$$

Alternatively, in Equation 40 a channel narrowing DW may be determined under the condition that the standard deviation of a variable rri is a minimum, because mask channel widths W$_{mWi}$ and W$_{mNa}$ are both constants.

Alternatively, since the condition that the standard deviation of the variation rri is a minimum is approximately equal to that the standard deviation of its inverse number rri$^{-1}$ is a minimum, a channel narrowing DW may be determined from the standard deviation of the inverse number rri$^{-1}$.

In the channel narrowing DW extraction according to the third or fourth preferred embodiment, when the mask cannel width W$_{mNa}$ of a narrow transistor is significantly smaller than the mask channel width W$_{mWi}$ of a wide transistor (i.e., W$_{mNA}$<<W$_{mWi}$), the difference between the mask channel width W$_{mWi}$ and a gate finished width W$_{gWi}$ hardly affects on determination of the value DW* of W$_m$ coordinate at a virtual point, thereby determines the channel narrowing DW of the narrow transistor at high accuracy. For instance, to evaluate device or circuit performance on the level of not more than 1.0 μm in pattern width, it is required to extract the channel narrowing DW of each transistor. For such an extraction, there are used two transistors, i.e., a narrow transistor and a wide transistor serving as a reference. In this case, the difference between a gate finished width W$_g$ and a mask channel width W$_m$ depends on the transistor, causing errors. Thus, description will be now given of such errors. The value DW$^{\#}$ of W$_m$ coordinate at a virtual point when a mask channel width W$_m$ is used is given by Equation 41.

$$DW^{\#} = \left(W_{mNa} - \frac{R'_{Wi}}{R'_{Na}} \cdot W_{mWi}\right) \cdot \left(1 - \frac{R'_{Wi}}{R'_{Na}}\right)^{-1} \quad \text{(Eq. 41)}$$

If W$_g$ coordinate of an intersection in a plane formed by gate finished width and source-drain conductance (i.e., a W$_g$–R plane) is represented by DW$_g^{\#}$, the following Equation 42 is obtained.

$$DW_g^{\#} = \left(W_{gNa} - \frac{R'_{Wi}}{R'_{Na}} \cdot W_{gWi}\right) \cdot \left(1 - \frac{R'_{Wi}}{R'_{Na}}\right)^{-1} \quad \text{(Eq. 42)}$$

If the difference between a gate finished width W$_g$ and a mask channel width W$_m$ is represented by ΔW, the difference between the gate finished width W$_{gWi}$ and mask channel width W$_{mWi}$ of a wide transistor, and the difference between the gate finished width W$_{gNa}$ and a mask channel width W$_{mNa}$ of a narrow transistor, are represented by ΔW$_{Wi}$ and ΔW$_{Na}$, respectively. Therefore, the relationships of Equations 43 and 44 are established. Then, from Equations 41 to 44, the difference between the value DW** of W$_m$ coordinate and the value DW$_g$* of W$_g$ coordinate at an intersection is expressed by Equation 45, where ΔW is defined in Equation 46.

$$W_{gWi} = W_{mWi} + \Delta W_{Wi} \quad \text{(Eq. 43)}$$

$$W_{gNa} = W_{mNa} + \Delta W_{Na} \quad \text{(Eq. 44)}$$

$$DW^{\#} - DW_g^{\#} = -\Delta W_{Na} + \frac{R'_{Wi}}{R'_{Na}} \cdot \left(1 - \frac{R'_{Wi}}{R'_{Na}}\right)^{-1} \cdot \Delta W \quad \text{(Eq. 45)}$$

$$\approx -\Delta W_{Na} + \frac{G'_{Wi}}{R'_{Na}} \cdot \Delta W$$

$$\approx -\Delta W_{Na} + \frac{W_{effNa}}{W_{effWi}} \cdot \Delta W$$

$$\Delta W \equiv \Delta W_{Wi} - \Delta W_{Na} \quad \text{(Eq. 46)}$$

Equations 43 and 44 show that the effective channel width W$_{eff}$ of a narrow transistor is extracted when the relationship W$_{mNA}$<<W$_{mWi}$ is established. In Equation 45, the second term of the last expression indicates an error. If a relative error is represented by r, it results in Equation 26. Therefore, again in the third and fourth preferred embodiments, to make a relative error smaller than the desired value, the same limitations are imposed upon the mask channel width W$_{gWi}$ of a wide transistor, as in the first and second preferred embodiments.

Consider now the influence of unequal channel lengths due to the irregularity of finished polygate. Source-drain resistance R$_{tot}$ is defined in Equation 47, where g is a channel sheet resistance.

$$R = \frac{L_{eff}}{W_{eff}} \cdot g + R_{sd} \quad \text{(Eq. 47)}$$

Let the difference in the channel length L between a narrow transistor and a wide transistor be ΔL(=L$_{effNa}$−L$_{effWi}$), Equations 47 can be modified into Equation 48.

$$R \approx \frac{L_{effWi}}{W_{effNa} \cdot \left(1 - \frac{\Delta L}{L_{effWi}}\right)} \cdot g + R_{sd} \quad \text{(Eq. 48)}$$

Supposing a sheet resistance g is independent of an effective channel length L$_{eff}$, Equation 48 shows that an effective channel length L$_{effNa}$ appears to be increased by a factor of (1−ΔL/L$_{effWi}$). Now, expressing a relative error by r, an error Δr is expressed by Equation 49.

$$W_{\mathit{effNa}} \cdot \frac{|\Delta L|}{L_{\mathit{effWi}}} < r \cdot W_{\mathit{effNa}} \quad \text{(Eq. 49)}$$

Supposing that an effective channel length $L_{\mathit{effWi}}$ is approximately equal to a mask channel length $L_{mWi}$, Equation 49 can be modified into Equation 50.

$$L_{mWi} > \frac{|\Delta L|}{r} \quad \text{(Eq. 50)}$$

Equation 50 imposes limitations upon the mask channel length $L_{mWi}$ of a wide transistor to be used in extraction. For instance, when $\Delta L=0.1$ μm and $r=0.02$, the mask channel width $W_{mWi}$ of a wide transistor is required to be greater than 5 μm, in order to accurately extract the effective channel width of a narrow transistor.

Figure 28:
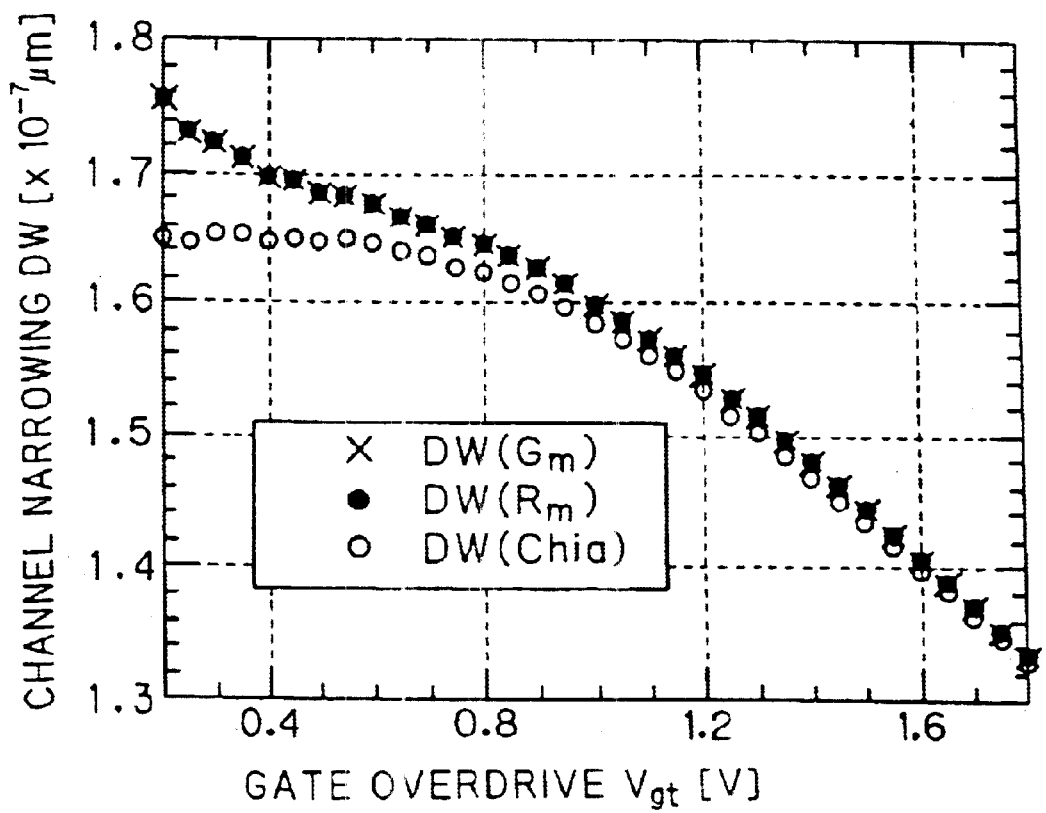
FIG. 28 is a graph for explaining the difference between the channel narrowing obtained by prior art characteristic evaluation method and the channel narrowing obtained by the characteristic evaluation method of the first or third preferred embodiment.

Description will be now given of the case where the characteristic evaluation method for insulated gate type transistors according to the first preferred embodiment (hereinafter referred to as Gm method) or that of the third preferred embodiment (referred to as Rm method) is applied to a MOS transistor having a mask channel width $W_m$ of 0.36 μm and a mask channel length $L_m$ of 20.4 μm. FIG. 28 gives a comparison among the channel narrowing DW (obtained by Gm method), DW (by Rm method), and DW (by Chia method). Both Gm and Rm methods provide nearly the same result. Since it is generally difficult to accurately determine a threshold voltage $V_{th}$, Gm method and Rm method ensure more accurate channel narrowing DW than Chia method.

Then, it is checked how the value dW* of $W_m$ intercept and the values DW*, DW# of W coordinate at an intersection depend on the gate overdrive $V_{gt}$ in the vicinity of zero. Now, expanding the channel narrowing DW, the slope h of a straight line and the inverse number g (g=1/f) of the slope f of the straight line, to the power of a gate overdrive $V_{gt}$, Equations 51 to 53 are obtained where DWG1, DWG2, and A to D are an arbitrary constant.

$$DW = \delta W - DWG1 \cdot V_{gt} - DWG2 \cdot V_{gt}^2 + O(V_{gt}^3) \quad \text{(Eq.51)}$$

$$h = \frac{A}{V_{gt}} + B + O(V_{gt}) \quad \text{(Eq. 52)}$$

$$g = \frac{C}{V_{gt}} + D + O(V_{gt}) \quad \text{(Eq. 53)}$$

In this case, dW**, DW* and DW# are expanded as follows.

$$dW^{**} \approx \delta W - DWG1 \cdot DWG2 \cdot V_{gt}^2 + O(V_{gt}^3) \quad \text{(Eq. 54)}$$

$$DW^* \approx = \delta W - 2 \cdot DWG1 \cdot V_{gt} - \left(3 \cdot DWG2 + \frac{D}{C} \cdot DWG1\right) \cdot V_{gt}^2 + O(V_{gt}^3) \quad \text{(Eq. 55)}$$

$$dW^{\#} \approx \delta W + \left(DWG2 + \frac{B}{A} \cdot DWG1\right) \cdot V_{gt}^2 + O(V_{gt}^3) \quad \text{(Eq. 56)}$$

Equations 54 to 56 indicate the following matters. When dW**, DW* and DW# are brought to near zero, they all converge on $\delta W$. When DWG1 and DWG2 are both positive numbers, DW* decreases rapidly than dW** as the gate overdrive $V_{gt}$ increases. DW# has a stationary point at $V_{gt}=0$, and increases by the square of $V_{gt}$ as the gate overdrive $V_{gt}$ increases. These indicate that the results given in FIGS. 6 and 22 are correct.

Figure 29:
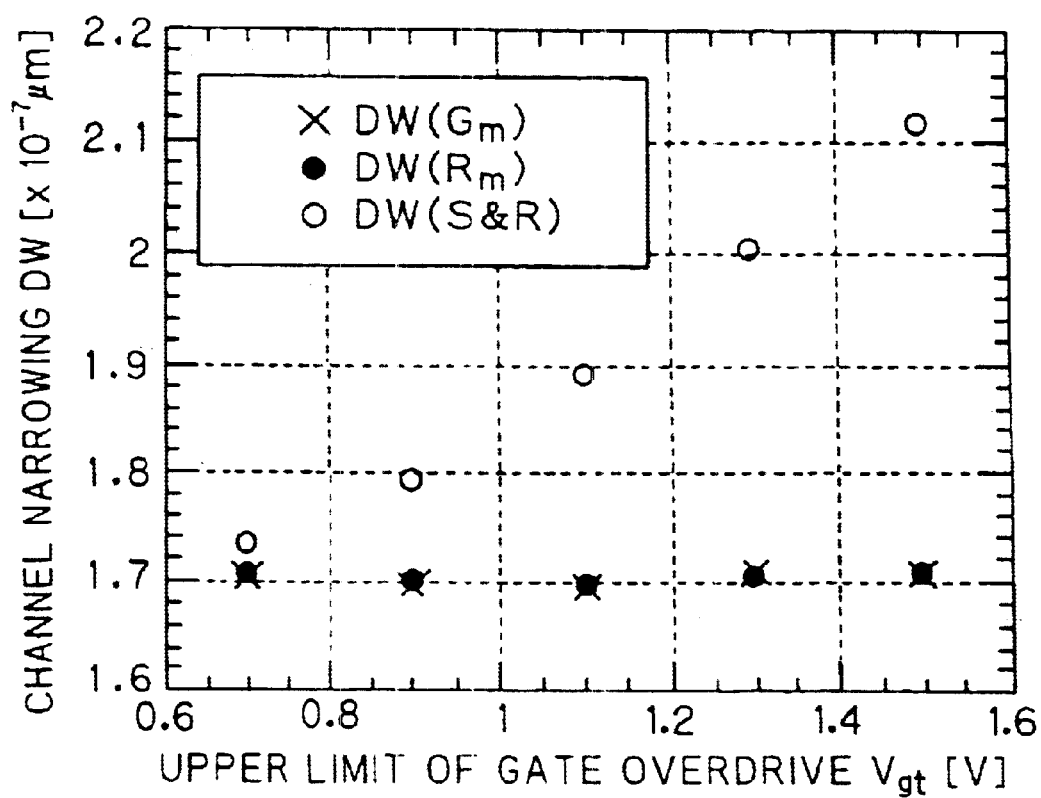
FIG. 29 is a graph showing the relationship between gate overdrive area set for calculation in the characteristic evaluation method of the first or third preferred embodiment, and channel narrowing.

Also, the presence of the stationary point at $V_{gt}=0$ suggests the possibility that $\delta W$ is determined so that DW# is constant when $V_{gt}$ is in the vicinity of zero. This is the case where "shift and ratio method" is applied to the extraction of a channel narrowing DW (this method is described, for example, in "A New "Shift and Ratio" Method for MOSFT Channel Length Extraction," IEEE Elect. Dev. Lett., EDL-13(5), p.267, 1992, by Y. Taur et al.). This method actually gives proper values, however, its extraction result depends greatly on the area of a gate overdrive $V_{gt}$ for calculation (see FIG. 29). On the other hand, both Rm method and Gm method are independent of the area of a gate overdrive $V_{gt}$ for calculation, and also can give nearly the same result.

While the invention has been shown and described in detail, the foregoing description is in all aspects illustrative and not restrictive. It is therefore understood that numerous modifications and variations can be devised without departing from the scope of the invention.

I claim:

1. A characteristic evaluation method for insulated gate type transistors, comprising:

a) preparing at least two insulated gate type transistors including first and second insulated gate type transistors that differ from each other only in mask channel width;

b) extracting a threshold voltage of said first transistor that has a mask channel width larger than that of said second transistor, estimating a threshold voltage of said second transistor, and employing a value of the estimated threshold voltage as a first estimated value;

c) when a difference between a gate voltage of said first transistor and said extracted threshold voltage of said first transistor is defined as a first gate overdrive, a difference between a gate voltage of said second transistor and said first estimated value is defined as a second gate overdrive, (i) under a condition that said first and second gate overdrives are equal in an X-Y plane whose X-axis is said mask channel width and Y-axis is source-drain conductance, extracting a virtual point at which a change in Y coordinate value is estimated to be approximately zero even if said first and second gate overdrives are finely changed, from points on a straight line passing through a first point whose X coordinate is said mask channel width of said first transistor and Y coordinate is said source-drain resistance of said second transistor, and a second point whose X coordinate is said mask channel width of said second transistor and Y coordinate is said source-drain resistance of said first transistor, (ii) defining values of the X coordinate and Y coordinate at said virtual points as second and third estimated values, respectively, and (iii) extracting a slope of said straight line at said virtual points and employing a value of the extracted slope as a fourth estimated value;

d) repeating said step c) while varying said first estimated value;

e) after said steps c) and d), determining a true threshold voltage of said second transistor by using said first to fourth estimated values; and f) determining a difference between said mask channel width and an effective channel width, based on said true threshold voltage.

2. The method of claim 1, wherein said step e) comprises: (i) finding, from said second to fourth estimated values, optimum second to fourth estimated values with which a change of said third estimated value is equal to a product of a change of said second estimated value and said fourth estimated value, in reply to fine changes of said first and second gate overdrives; (ii) determining an optimum first estimated value that corresponds to said optimum second to fourth estimated values; and (iii) determining the true threshold voltage of said second transistor, based on said optimum first estimated value.

3. The method of claim 2, wherein in said step e), said optimum second to fourth estimated values are determined from a relational expression:

$$F(\delta, V_{gtWi}) = \frac{h^2(\delta, V_{gtWi})}{h'(\delta, V_{gtWi})} \cdot dW^{**\prime}(\delta, V_{gtWi}) - R^{\#}(\delta, V_{gtWi})$$

where $\delta$ is a difference between the first estimated value and the threshold voltage of said first transistor; $V_{gtWi}$ is said first gate overdrive; $dW^{**}$ is a value of an X intercept that is obtained by extrapolating said straight line; h is said slope of said straight line; $R^{\#}$ is a Y coordinate value at said virtual point; and a prime is the first-order differentiation of $V_{gtWi}$.

4. The method of claim 2, wherein in said step e), said optimum second to fourth estimated values are determined from a relational expression:

$$F(\delta, V_{gtWi}) = R^{}(\delta, V_{gtWi}) - \frac{h(\delta, V_{gtWi})}{h'(\delta, V_{gtWi})} \cdot R^{\prime}(\delta, V_{gtWi}) - R^{\#}(\delta, V_{gtWi})$$

where $\delta$ is a difference between the first estimated value and the threshold voltage of said first transistor; $V_{gtWi}$ is said first gate overdrive; $R^{**}$ is a value of a Y intercept that is obtained by extrapolating said straight line; h is said slope of said straight line; $R^{\#}$ is a Y coordinate value at said virtual point; and a prime is the first-order differentiation of $V_{gtWi}$.

5. The method of claim 2, wherein in said step e), said optimum second to fourth estimated values are determined from a relational expression:

$$F(\delta, V_{gtWi}) = \frac{R^{**\prime}(\delta, V_{gtWi})}{h'(\delta, V_{gtWi})} + DW^{\#}(\delta, V_{gtWi})$$

where $\delta$ is a difference between the first estimated value and the threshold voltage of said first transistor; $V_{gtWi}$ is said first gate overdrive; $R^{**}$ is a value of a Y intercept that is obtained by extrapolating said straight line; h is said slope of said straight line; $DW^{\#}$ is an X coordinate value at said virtual point; and a prime is the first-order differentiation of $V_{gtWi}$.

6. The method of claim 2, wherein in said step e), said optimum second to fourth estimated values are determined from a relational expression:

$$F(\delta, V_{gtWi}) = dW^{}(\delta, V_{gtWi}) + \frac{h(\delta, V_{gtWi})}{h'(\delta, V_{gtWi})} \cdot dW^{\prime}(\delta, V_{gtWi}) - DW^{\#}(\delta, V_{gtWi})$$

where $\delta$ is a difference between the first estimated value and the threshold voltage of said first transistor; $V_{gtWi}$ is said first gate overdrive; $dW^{**}$ is a value of an X intercept that is obtained by extrapolating said straight line; h is said slope of said straight line; $DW^{\#}$ is an X coordinate value at said virtual point; and a prime is a first-order differentiation of $V_{gtWi}$.

7. The method of claim 1, wherein said step e) comprises: (i) finding, an optimum first estimated value with which a characteristic curve exhibiting the relationship between said second gate overdrive and said second estimated value has a predetermined shape in a predetermined range of said second gate overdrive in an X-Y plane whose X-axis is said second gate overdrive and Y-axis is said second estimated value; and (ii) determining the true threshold voltage of said second transistor, based on said optimum first estimated value.

8. The method of claim 7, wherein said step e) comprises estimating an optimum characteristic curve with which said second estimated value is best converged on a fixed value in said predetermined range, from said characteristic curve in plural.

9. The method of claim 1, wherein in said step f), a difference between said mask channel width and an effective channel width is determined from said second estimated value when said gate overdrive is in a vicinity of 0 V.

* * * * *